United States Patent
Cui et al.

(10) Patent No.: US 12,255,051 B2
(45) Date of Patent: Mar. 18, 2025

(54) MULTI-SHAPE VOLTAGE PULSE TRAINS FOR UNIFORMITY AND ETCH PROFILE TUNING

(71) Applicant: Applied Materials, Inc., Santa Clara, CA (US)

(72) Inventors: Linying Cui, Cupertino, CA (US); James Rogers, Los Gatos, CA (US); Daniel Sang Byun, Campbell, CA (US); Rajinder Dhindsa, Pleasanton, CA (US); Keith Hernandez, Santa Clara, CA (US)

(73) Assignee: Applied Materials, Inc., Santa Clara, CA (US)

(*) Notice: Subject to any disclaimer, the term of this patent is extended or adjusted under 35 U.S.C. 154(b) by 310 days.

(21) Appl. No.: 17/983,926

(22) Filed: Nov. 9, 2022

(65) Prior Publication Data
US 2024/0153741 A1   May 9, 2024

(51) Int. Cl.
*H01J 37/32* (2006.01)
(52) U.S. Cl.
CPC .. *H01J 37/32128* (2013.01); *H01J 37/32146* (2013.01); *H01J 37/32091* (2013.01); *H01J 2237/3341* (2013.01)
(58) Field of Classification Search
None
See application file for complete search history.

(56) References Cited

U.S. PATENT DOCUMENTS

| | | | |
|---|---|---|---|
| 11,610,761 B2* | 3/2023 | Fairbairn | C23C 16/4586 |
| 2007/0269013 A1* | 11/2007 | Liu | G01N 23/087 |
| | | | 378/119 |
| 2020/0168437 A1 | 5/2020 | Ziemba et al. | |
| 2021/0050185 A1 | 2/2021 | Martinez et al. | |
| 2021/0104382 A1 | 4/2021 | Kim et al. | |
| 2022/0037119 A1 | 2/2022 | Dorf et al. | |
| 2022/0392749 A1 | 12/2022 | Ventzek et al. | |
| 2022/0399186 A1* | 12/2022 | Cui | H01L 21/6833 |

(Continued)

FOREIGN PATENT DOCUMENTS

KR   1020150129942 A   11/2015

OTHER PUBLICATIONS

Internataional Search Report/Written Opinion issued to PCT/US2022/052059 on Jan. 4, 2024.

*Primary Examiner* — Allan W. Olsen
(74) *Attorney, Agent, or Firm* — Patterson + Sheridan, LLP

(57) ABSTRACT

Embodiments of the disclosure provided herein include a method for processing a substrate in a plasma processing system. The method includes receiving a first synchronization waveform signal from a controller, delivering a first burst of first voltage pulses to an electrode assembly after receiving a first portion of the first synchronization waveform signal, wherein at least one first parameter of the first voltage pulses is set to a first value based on a first waveform parameter within the first portion of the first synchronization waveform signal, and delivering a second burst of second voltage pulses to the electrode assembly after receiving a second portion of the first synchronization waveform signal, wherein the at least one first parameter of the first voltage pulses is set to a second value based on a difference in the first waveform parameter within the second portion of the first synchronization waveform signal.

21 Claims, 11 Drawing Sheets

(56) References Cited

U.S. PATENT DOCUMENTS

| | | | |
|---|---|---|---|
| 2023/0132339 A1* | 4/2023 | Dhindsa | H01J 37/3299 438/798 |
| 2023/0178336 A1* | 6/2023 | Rogers | H01J 37/32146 438/714 |

* cited by examiner

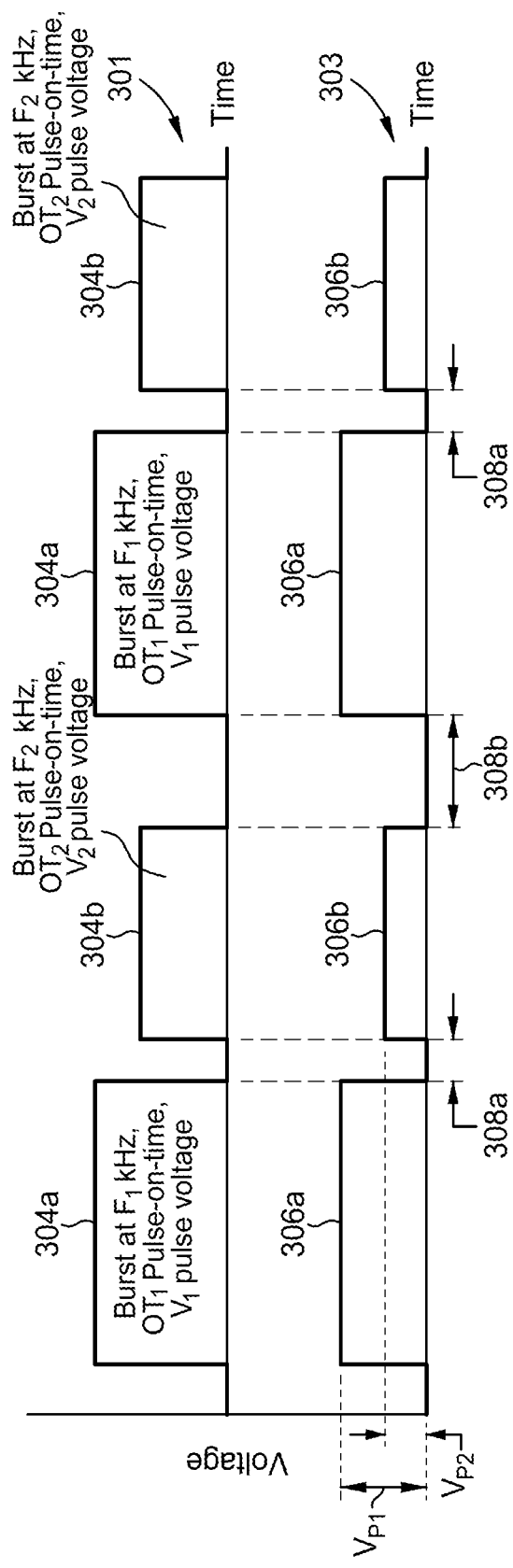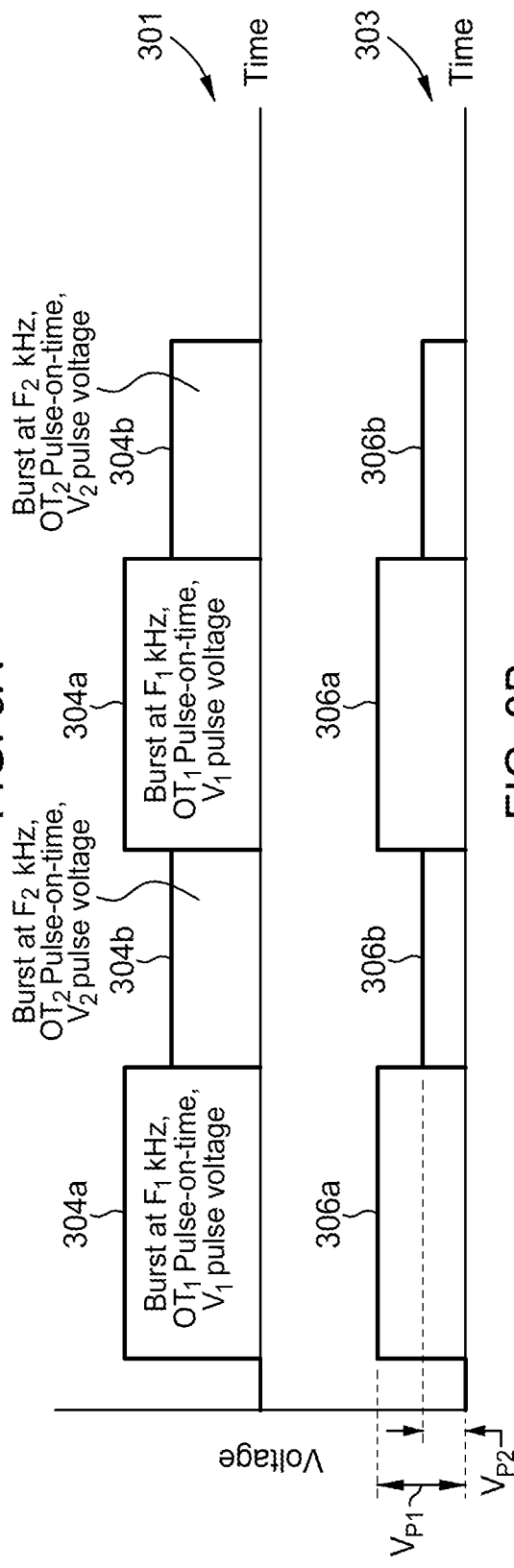
FIG. 3A
FIG. 3B

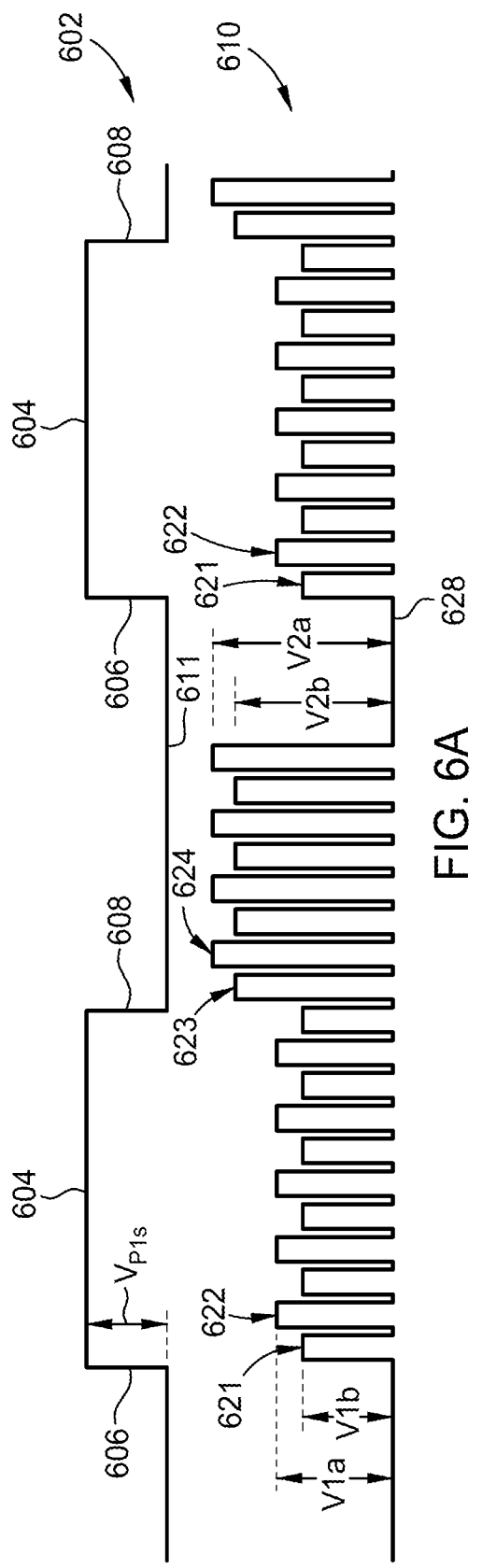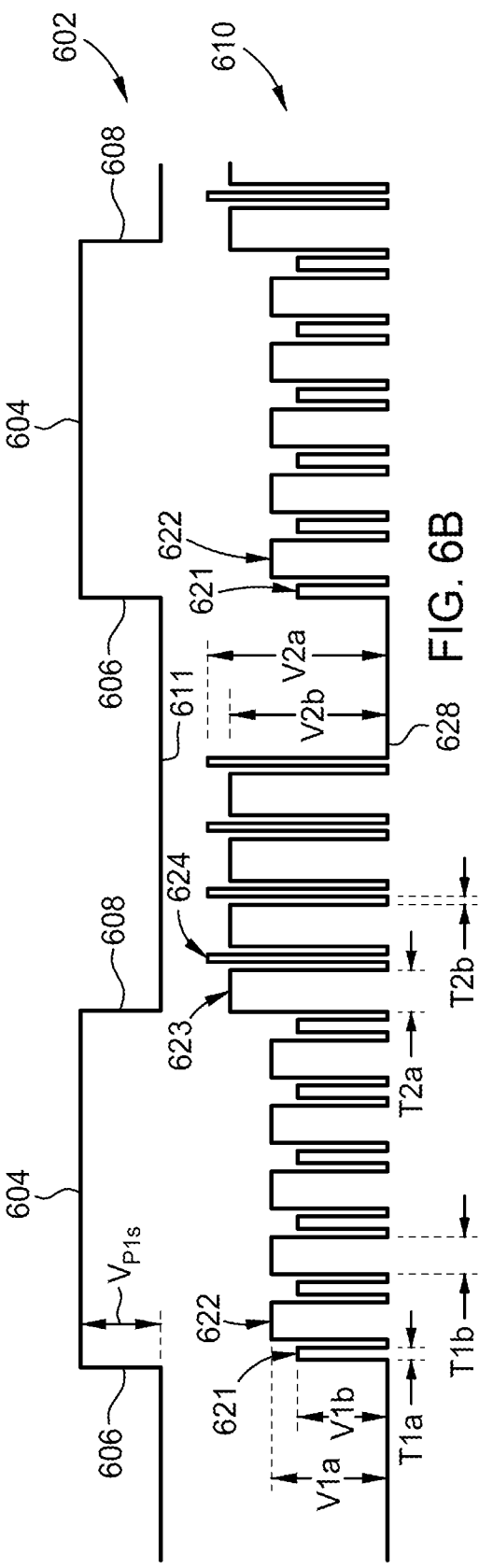

MULTI-SHAPE VOLTAGE PULSE TRAINS FOR UNIFORMITY AND ETCH PROFILE TUNING

BACKGROUND

Field

Embodiments described herein generally relate to semiconductor device manufacturing hardware and processes, and more specifically to an apparatus and methods of controlling the delivery of power to a plasma formed in plasma processing chamber used in semiconductor manufacturing.

Description of the Related Art

A typical Reactive Ion Etch (RIE) plasma processing chamber includes a radio frequency (RF) bias generator, which supplies an RF voltage to a "power electrode" (e.g., a biasing electrode), such as a metal plate positioned adjacent to an "electrostatic chuck" (ESC) assembly, more commonly referred to as the "cathode". The power electrode can be capacitively coupled to the plasma of a processing system through a thick layer of dielectric material (e.g., ceramic material), which is a part of the ESC assembly. In a capacitively coupled gas discharge, the plasma is created by using a radio frequency (RF) generator that is coupled to an RF electrode through an RF matching network ("RF match") that tunes the apparent load to 50Ω to minimize the reflected power and maximize the power delivery efficiency. The application of RF voltage to the power electrode causes an electron-repelling plasma sheath (also referred to as the "cathode sheath") to form over a processing surface of a substrate that is positioned on a substrate supporting surface of the ESC assembly during processing. The non-linear, diode-like nature of the plasma sheath results in rectification of the applied RF field, such that a direct-current (DC) voltage drop, or "self-bias", appears between the substrate and the plasma, making the substrate potential negative with respect to the plasma potential. This voltage drop determines the average energy of the plasma ions accelerated towards the substrate, and thus etch anisotropy. More specifically, ion directionality, the feature profile, and etch selectivity to the mask and the stop-layer are controlled by the Ion Energy Distribution Function (IEDF) and the Electron Energy Distribution function (EEDF). In plasmas with RF bias, the IEDF typically has two non-discrete peaks, one at a low energy and one at a high energy, and an ion population that has a range of energies that extend between the two peaks. The presence of the ion population in-between the two peaks of the IEDF is reflective of the fact that the voltage drop between the substrate and the plasma oscillates at the RF bias frequency. When a lower frequency RF bias generator is used to achieve higher self-bias voltages, the difference in energy between these two peaks can be significant; and because the etch profile due to the ions at low energy peak is more isotropic, this could potentially lead to bowing of the etched feature walls. Compared to the high-energy ions, the low-energy ions are less effective at reaching the corners at the bottom of the etched feature (e.g., due to the charging effect), but cause less sputtering of the mask material. This is important in high aspect ratio etch applications, such as hard-mask opening or dielectric mold etch. As feature sizes continue to diminish and the aspect ratio increases, while feature profile control requirements become more stringent, it becomes more desirable to have a well-controlled IEDF and EEDF at the substrate surface during processing.

Other conventional plasma processes and processing chamber designs have also found that delivering multiple different RF frequencies to one or more of the electrodes in a plasma processing chamber can be used to control various plasma properties, such as plasma density, ion energy, and/or plasma chemistry. However, it has been found that the delivery of multiple conventional sinusoidal waveforms from two or more RF sources, which are each configured to provide different RF frequencies, is unable to adequately or desirably control the sheath properties and can lead to undesirable arcing problems. Moreover, due to direct or capacitive coupling between the RF sources during processing, each RF source may induce an RF current that is provided to the output of the other connected RF source(s) (e.g., often referred to as the "cross-talk"), resulting in the power being diverted away from the intended load (plasma), as well as a possibly causing damage to each of the RF sources.

Accordingly, there is a need in the art for novel, robust and reliable plasma processing and biasing methods that enable maintaining a nearly constant sheath voltage, and thus create a desirable and repeatable IEDF and EEDF at the surface of the substrate to enable a precise control over the etch profile of the features formed in the surface of the substrate.

SUMMARY

Embodiments of the disclosure provided herein include a method for processing a substrate in a plasma processing system. The method will include: receiving, by a waveform generator, a first synchronization waveform signal from a controller; delivering, by the waveform generator, a first burst of first voltage pulses to an electrode assembly disposed within the plasma processing system after receiving a first portion of the first synchronization waveform signal, wherein at least one first parameter of the first voltage pulses is set to a first value based on a first waveform parameter within the first portion of the first synchronization waveform signal; and delivering, by the waveform generator, a second burst of second voltage pulses to the electrode assembly disposed within the plasma processing system after receiving a second portion of the first synchronization waveform signal, wherein the at least one first parameter of the first voltage pulses is set to a second value based on a difference in the first waveform parameter within the second portion of the first synchronization waveform signal. In some embodiments, the first voltage pulses and the second voltage pulses are asymmetric voltage pulses.

Embodiments of the disclosure provided herein may also include a method for processing a substrate in a plasma processing system. The method will include: receiving, by a waveform generator, a first synchronization waveform signal from a controller of the plasma processing system; delivering a first burst of first voltage pulses, by the waveform generator, to an electrode assembly disposed within the plasma processing system based on a first waveform pulse provided within the first synchronization waveform signal; and adjusting, by the waveform generator, at least one first parameter of the first voltage pulses between a first set of values based on a characteristic of the first waveform pulse provided within the first synchronization waveform signal and a second set of values based on a characteristic of the first waveform pulse provided within the first synchronization waveform signal.

Embodiments of the disclosure provided herein may also include a plasma processing chamber comprising: a voltage waveform generator configured to deliver a first pulsed voltage waveform to an electrode assembly disposed within the plasma processing chamber; a controller; and a memory for storing a program to be executed in the controller. The program includes instructions which when executed cause the voltage waveform generator to: receive a first synchronization waveform signal from the controller; deliver the first burst of first voltage pulses to the electrode assembly disposed within the plasma processing system after receiving a first portion of the first synchronization waveform signal, wherein at least one first parameter of the first voltage pulses is set to a first value based on a parameter of the first portion of the first synchronization waveform signal; and deliver a second burst of second voltage pulses to the electrode assembly disposed within the plasma processing system after receiving a second portion of the first synchronization waveform signal, wherein a value of at least one first parameter of the second voltage pulses and the first pulsed voltage waveform are different based on a difference in the first portion and the second portion of the first synchronization waveform signal. The program may also further comprise instructions to: deliver a third burst of third voltage pulses after receiving a third portion of the first synchronization waveform signal, wherein at least one first parameter of the third voltage pulses is set to a third value based on a parameter of the third portion of the first synchronization waveform signal; and deliver a fourth burst of fourth voltage pulses after receiving a fourth portion of the first synchronization waveform signal, wherein at least one first parameter of the fourth voltage pulses is set to a fourth value based on a parameter of the fourth portion of the first synchronization waveform signal, and the at least one first parameter of each of the voltage pulses are the same parameters.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, and may admit to other equally effective embodiments.

FIGS. 3A and 3B illustrate bursts of a PV waveform generated by a PV waveform generator delivered to a bias electrode, according to certain embodiments.

FIGS. 6A and 6B each illustrate an example asymmetric pulsed voltage that are delivered to a bias electrode and a synchronization signal delivered to a PV waveform generator according to certain embodiments.

DETAILED DESCRIPTION

Figure 1:
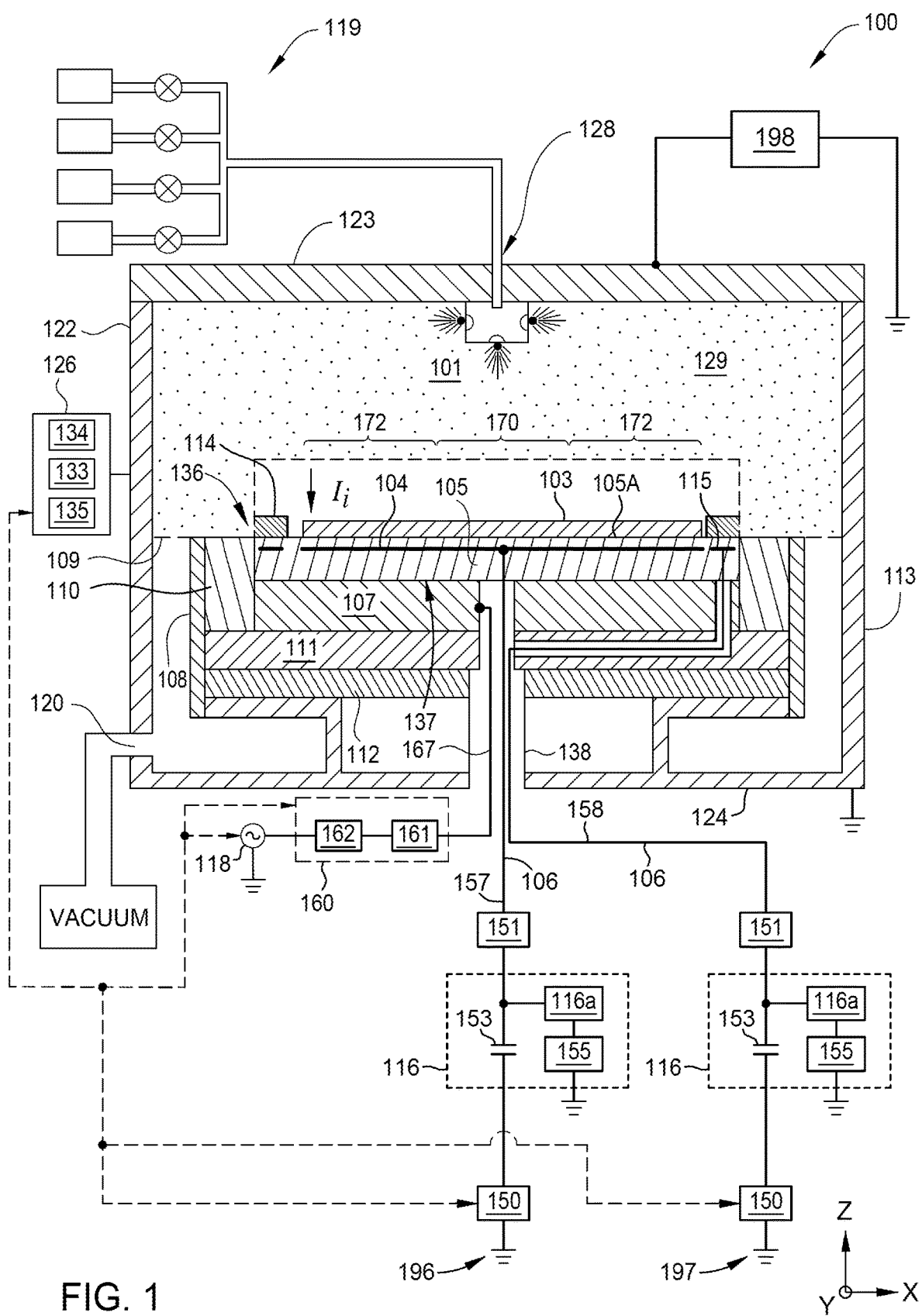
FIG. 1 is a schematic cross-sectional view of a processing chamber, in which a complex load is formed during plasma processing, according to certain embodiments.

Embodiments of the disclosure provided herein include an apparatus and method for the plasma processing of a substrate in a processing chamber. More specifically, embodiments of this disclosure describe a biasing scheme that is configured to provide a radio frequency (RF) generated RF waveform from an RF generator to one or more electrodes within a processing chamber and a pulsed-voltage (PV) waveform delivered from one or more pulsed-voltage (PV) generators to the one or more electrodes within the processing chamber. In general, the generated RF waveform is configured to establish and maintain a plasma within the processing chamber, and the delivered PV waveform(s) are configured to establish a desired sheath voltage across the surface of a substrate during one or more phases of a plasma process and thus create a desirable ion energy distribution function (IEDF) and electron energy distribution function (EEDF) at the surface of the substrate during the one or more plasma processing phases performed on the substrate within the processing chamber. The plasma process(es) disclosed herein can be used to control the shape of IEDF and EEDF and thus the interaction of the plasma with a surface of a substrate during processing. In some configurations, the plasma process(es) disclosed herein are used to control the profile of features formed in the surface of the substrate during processing. In some embodiments, the pulsed voltage waveform is established by a PV generator that is electrically coupled to a biasing electrode disposed within a substrate support assembly disposed within a plasma processing chamber.

During some semiconductor plasma processes, ions are purposely accelerated towards the substrate by the voltage drop in an electron-repelling sheath that forms over the substrate placed on top of a substrate-support assembly 136. While not intending to be limiting as to the scope of the disclosure provided herein, the substrate support assembly 136 is often referred to herein as the "cathode assembly" or "cathode". In some embodiments, the substrate support assembly 136 includes a substrate support 105 and a support base 107. The substrate support 105 can include an electrostatic chuck (ESC) assembly that is configured to chuck (e.g., retain) a substrate on a substrate receiving surface 105A.

In some embodiments of the disclosure provided herein, a processing chamber is configured to provide a capacitively coupled gas discharge, such that a plasma is created by use of an RF generator assembly that includes an RF generator that is coupled to an RF electrode through an RF matching network ("RF match"). The RF matching network is configured to tune the apparent load to 50Ω to minimize the reflected power and maximize the power delivery efficiency. In some embodiments, the RF electrode includes a metal plate that is positioned parallel to the plasma-facing surface of the substrate.

Additionally, during the plasma processing methods disclosed herein, an ion-accelerating cathode sheath is generally formed during plasma processing by use of a pulsed-voltage (PV) generator that is configured to establish a pulsed-voltage waveform at one or more biasing electrodes 104 disposed within the substrate support assembly 136. In some embodiments, the one or more biasing electrodes 104 include a chucking electrode that is separated from the substrate by a thin layer of a dielectric material formed within the substrate support assembly 136 (e.g., electrostatic chuck (ESC) assembly) and optionally an edge control electrode that is disposed within or below an edge ring 114 that surrounds a substrate 103 when the substrate 103 is disposed on the substrate supporting surface 105A of the substrate support assembly 136.

Plasma Processing Chamber Example

FIG. 1 is a schematic cross-sectional view of a plasma processing chamber 100, in which a complex load is formed during plasma processing, according to certain embodiments. The plasma processing chamber 100 is configured to practice one or more of the biasing schemes proposed herein, according to one or more embodiments. In one embodiment, the processing chamber is a plasma processing chamber, such as a reactive ion etch (RIE) plasma chamber. In some other embodiments, the processing chamber is a plasma-enhanced deposition chamber, for example a plasma-enhanced chemical vapor deposition (PECVD) chamber, a plasma enhanced physical vapor deposition (PEPVD) chamber, or a plasma-enhanced atomic layer deposition (PEALD) chamber. In some other embodiments, the processing chamber is a plasma treatment chamber, or a plasma based ion implant chamber, for example a plasma doping (P LAD) chamber. In some embodiments, the plasma source is a capacitively coupled plasma (CCP) source, which includes an electrode (e.g., chamber lid 123) disposed in the processing volume facing the substrate support assembly 136. In some configurations, an opposing electrode, such as the chamber lid 123, which is positioned opposite to the substrate support assembly 136, is electrically coupled to ground. However, as illustrated in FIG. 1, the opposing electrode can alternately be electrically coupled to a source 198 that is coupled to ground, such as a source that includes an RF generator or a PV generator. In yet other embodiments, the processing chamber may alternately, or additionally, include an inductively coupled plasma (ICP) source electrically coupled to a radio frequency (RF) power supply.

The plasma processing chamber 100 also includes a chamber body 113 that includes the chamber lid 123, one or more sidewalls 122, and a chamber base 124, which define a processing volume 129. The one or more sidewalls 122 and chamber base 124 generally include materials that are sized and shaped to form the structural support for the elements of the plasma processing chamber 100, and are configured to withstand the pressures and added energy applied to them while a plasma 101 is generated within a vacuum environment maintained in the processing volume 129 of the plasma processing chamber 100 during processing. In one example, the one or more sidewalls 122 and chamber base 124 are formed from a metal, such as aluminum, an aluminum alloy, or a stainless steel. A gas inlet 128 disposed through the chamber lid 123 is used to provide one or more processing gases to the processing volume 129 from a processing gas source 119 that is in fluid communication therewith. A substrate 103 is loaded into, and removed from, the processing volume 129 through an opening (not shown) in one of the one or more sidewalls 122, which is sealed with a slit valve (not shown) during plasma processing of the substrate 103. Herein, the substrate 103 is transferred to and from a substrate receiving surface 105A of an ESC substrate support 105 using a lift pin system (not shown).

In some embodiments, an RF generator assembly 160 is configured to deliver RF power to the support base 107 disposed proximate to the ESC substrate support 105, and within the substrate support assembly 136. The RF power delivered to the support base 107 is configured to ignite and maintain a processing plasma 101 formed by use of processing gases disposed within the processing volume 129. In some embodiments, the support base 107 is an RF electrode that is electrically coupled to an RF generator 118 via an RF matching circuit 162 and a first filter assembly 161, which are both disposed within the RF generator assembly 160. In some embodiments, the plasma generator assembly 160 and RF generator 118 are used to ignite and maintain a processing plasma 101 using the processing gases disposed in the processing volume 129 and fields generated by the RF power provided to the support base 107 by the RF generator 118. The processing volume 129 is fluidly coupled to one or more dedicated vacuum pumps, through a vacuum outlet 120, which maintain the processing volume 129 at sub-atmospheric pressure conditions and evacuate processing and/or other gases, therefrom. A substrate support assembly 136, disposed in the processing volume 129, is disposed on a support shaft 138 that is grounded and extends through the chamber base 124. However, in some embodiments, the RF generator assembly 160 is configured to deliver RF power to the biasing electrode 104 disposed in the substrate support 105 versus the support base 107.

The substrate support assembly 136, as briefly discussed above, generally includes a substrate support 105 (e.g., ESC substrate support) and support base 107. In some embodiments, the substrate support assembly 136 can additionally include an insulator plate 111 and a ground plate 112. The substrate support 105 is thermally coupled to and disposed on the support base 107. In some embodiments, the support base 107 is configured to regulate the temperature of the substrate support 105, and the substrate 103 disposed on the substrate support 105, during substrate processing. In some embodiments, the support base 107 includes one or more cooling channels (not shown) disposed therein that are fluidly coupled to, and in fluid communication with, a coolant source (not shown), such as a refrigerant source or water source having a relatively high electrical resistance. In some embodiments, the substrate support 105 includes a heater (not shown), such as a resistive heating element embedded in the dielectric material thereof. Herein, the support base 107 is formed of a corrosion resistant thermally conductive material, such as a corrosion resistant metal, for example aluminum, an aluminum alloy, or a stainless steel and is coupled to the substrate support with an adhesive or by mechanical means.

The support base 107 is electrically isolated from the chamber base 124 by the insulator plate 111, and the ground plate 112 is interposed between the insulator plate 111 and the chamber base 124. In some embodiments, the plasma processing chamber 100 further includes a quartz pipe 110, or collar, that at least partially circumscribes portions of the substrate support assembly 136 to prevent corrosion of the ESC substrate support 105 and, or, the support base 107 from contact with corrosive processing gases or plasma, cleaning gases or plasma, or byproducts thereof. Typically, the quartz pipe 110, the insulator plate 111, and the ground plate 112 are circumscribed by a liner 108. Herein, a plasma screen 109 approximately coplanar with the substrate receiving surface of the ESC substrate support 105 prevents plasma from forming in a volume between the liner 108 and the one or more sidewalls 122.

The substrate support 105 is typically formed of a dielectric material, such as a bulk sintered ceramic material, such as a corrosion resistant metal oxide or metal nitride material, for example aluminum oxide ($Al_2O_3$), aluminum nitride (AlN), titanium oxide (TiO), titanium nitride (TiN), yttrium oxide ($Y_2O_3$), mixtures thereof, or combinations thereof. In embodiments herein, the substrate support 105 further includes a biasing electrode 104 embedded in the dielectric material thereof. In one configuration, the biasing electrode 104 is a chucking pole used to secure (chuck) the substrate 103 to a substrate receiving surface 105A of the substrate support 105, also referred to herein as an ESC substrate support, and to bias the substrate 103 with respect to the processing plasma 101 using one or more of the pulsed-voltage biasing schemes described herein. Typically, the biasing electrode 104 is formed of one or more electrically conductive parts, such as one or more metal meshes, foils, plates, or combinations thereof. In some embodiments, the biasing electrode 104 is electrically coupled to a bias compensation module 116, which provides a chucking voltage thereto, such as static DC voltage between about −5000 V and about 5000 V, using an electrical conductor, such as the coaxial transmission line 106 (e.g., a coaxial cable). The high voltage module 116 includes bias compensation circuit elements 116A, a DC power supply 155, and a blocking capacitor 153. A bias compensation module blocking capacitor, which is also referred to herein as the blocking capacitor 153, is disposed between the output of a pulsed-voltage waveform generator (PVWG) 150 and the biasing electrode 104.

The biasing electrode 104 is spaced apart from the substrate receiving surface 105A of the substrate support 105, and thus from the substrate 103, by a layer of dielectric material of the substrate support 105. Depending on the type of electrostatic chucking method utilized within the substrate support 105 to retain a substrate 103 during processing, such as a coulombic ESC or a Johnsen-Rahbek ESC, the effective circuit elements used to model the electrical coupling of the biasing electrode 104 to the plasma 101 will vary. Herein, the biasing electrode 104 is electrically coupled to the output of the pulsed-voltage waveform generator (PVWG) 150 using the external conductor, such as the transmission line 106, which is disposed within the support shaft 138.

The substrate support assembly 136 further includes an edge control electrode 115 that is positioned below the edge ring 114 and surrounds the biasing electrode 104 so that when biased, due to its position relative to the substrate 103, it can affect or alter a portion of the generated plasma 101 that is at or outside of the edge of the substrate 103. The edge control electrode 115 can be biased by use of a pulsed-voltage waveform generator (PVWG) 150 that is different from the pulsed-voltage waveform generator (PVWG) 150 that is used to bias the biasing electrode 104. In one configuration, a first PV waveform generator 150 of a first PV source assembly 196 is configured to bias the biasing electrode 104, and a second PV waveform generator 150 of a second PV source assembly 197 is configured to bias the edge control electrode 115. In one embodiment, the edge control electrode 115 is positioned within a region of the substrate support 105, as shown in FIG. 1. In general, for plasma processing chambers 100 that are configured to process circular substrates, the edge control electrode 115 is annular in shape, is made from a conductive material and configured to surround at least a portion of the biasing electrode 104. In some embodiments, as illustrated in FIG. 1, the edge control electrode 115 includes a conductive mesh, foil or plate that is disposed a similar distance (i.e., Z-direction) from the surface 105A of the substrate support 105 as the biasing electrode 104. In some other embodiments, the edge control electrode 115 includes a conductive mesh, foil or plate that is positioned on or within a region of the dielectric pipe 110 (e.g., AlN, or $Al_2O_3$), which surrounds at least a portion of the biasing electrode 104 and/or the substrate support 105. Alternately, in some other embodiments, the edge control electrode 115 is positioned within or is coupled to the edge ring 114, which is disposed adjacent to the substrate support 105. In this configuration, the edge ring 114 is formed from a semiconductor or dielectric material (e.g., AlN, $Al_2O_3$, etc.).

The plasma processing chamber 100 further includes a controller 126, which is also referred to herein as a processing chamber controller. The controller 126 herein includes a central processing unit (CPU) 133, a memory 134, and support circuits 135. The controller 126 is used to control the process sequence used to process the substrate 103 including the substrate biasing methods described herein. The CPU 133 is a general-purpose computer processor configured for use in an industrial setting for controlling processing chamber and sub-processors related thereto. The memory 134 described herein, which is generally non-volatile memory, may include random access memory, read only memory, floppy or hard disk drive, or other suitable forms of digital storage, local or remote. The support circuits 135 are conventionally coupled to the CPU 133 and comprise cache, clock circuits, input/output subsystems, power supplies, and the like, and combinations thereof. Software instructions (program) and data can be coded and stored within the memory 134 for instructing a processor within the CPU 133. A software program (or computer instructions) readable by CPU 133 in the controller 126 determines which tasks are performable by the components in the plasma processing chamber 100. Preferably, the program, which is readable by CPU 133 in the controller 126, includes code, which when executed by the processor (CPU 133), perform tasks relating to the monitoring and execution of the electrode biasing scheme described herein. The program will include instructions that are used to control the various hardware and electrical components within the plasma processing chamber 100 to perform the various process tasks and various process sequences used to implement the electrode biasing scheme described herein.

During processing, the PV generators within the PV waveform generators 150 of the first PV source assembly 196 and the second PV source assembly 197 establishes a pulsed voltage waveform on the load disposed with the plasma processing chamber 100. The overall control of the delivery of the PV waveform from each of the PV waveform generators 150 is controlled by use of signals provided from the controller 126. Each PV waveform generator 150 will include a PV generator (e.g., DC power supply) and one or more electrical components, such as high repetition rate switches, capacitors (not shown), inductors (not shown), fly back diodes (not shown), power transistors (not shown) and/or resistors (not shown), that are configured to provide a PV waveform.

The PV transmission line 157, electrically connects the output of the PV waveform generator 150 to the second filter assembly 151. The PV transmission line 158 of the second PV source assembly 197, couples a PV waveform generator 150 to the edge control electrode 115, will include the same or similar components. The electrical conductor(s) within the various parts of the PV transmission line 157, 158 may include: (a) a coaxial transmission line (e.g., coaxial line 106), which may include a flexible coaxial cable that is connected in series with a rigid coaxial transmission line, (b) an insulated high-voltage corona-resistant hookup wire, (c) a bare wire, (d) a metal rod, (e) an electrical connector, or (f) any combination of electrical elements in (a)-(e).

Pulse Waveform Examples

Figure 2:
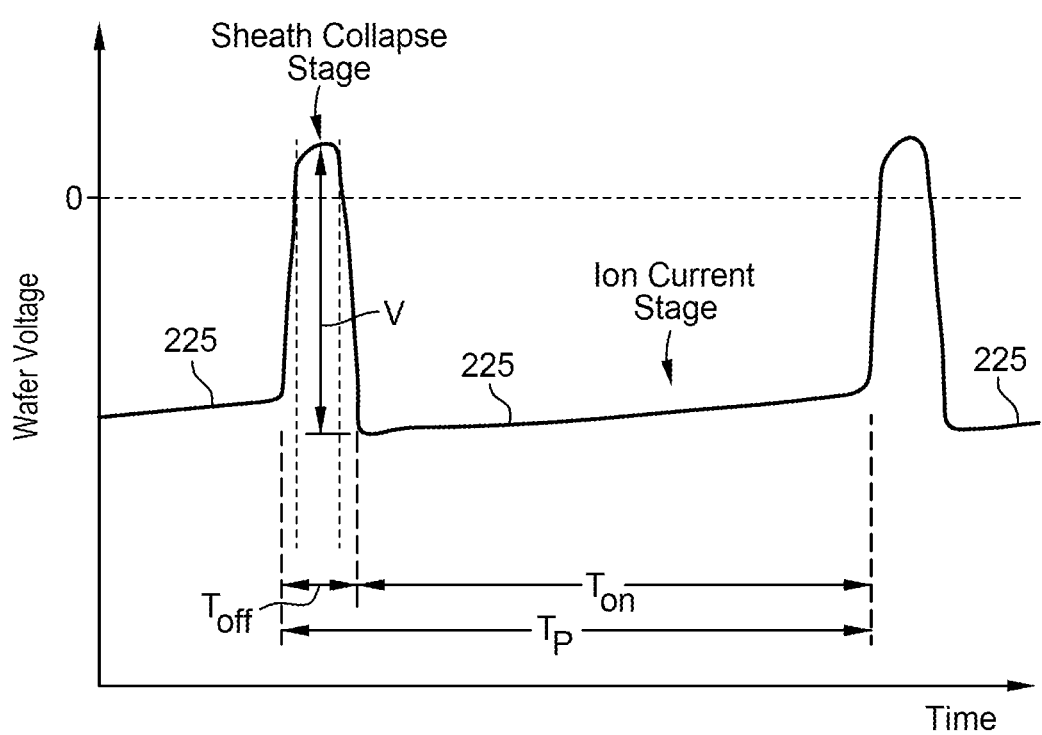
FIG. 2 illustrates an example of voltage pulses provided within a voltage waveform that is established at a substrate due to the delivery of voltage pulses to a bias electrode during plasma processing by use of the PV waveform generator, according to certain embodiments.

FIG. 2 illustrates an example of a pulsed voltage waveform that includes voltage pulses provided within the pulsed voltage waveform that is established at a substrate due to the delivery of voltage pulses to a bias electrode during plasma processing by use of the PV waveform generator, according to certain embodiments. In some embodiments, the voltage pulses disclosed herein are a series of asymmetric voltage pulses, as shown in FIG. 2. It has been found that the establishment of the PV waveforms to a substrate during plasma processing can be advantageously used to control aspects of the plasma sheath formed over the surface of the substrate during plasma processing. The control of the magnitude and shape of plasma sheath formed over the surface of the substrate allows the control of the ion interaction with the surface of the substrate during processing, such as allowing the control the ion energy distribution function (IEDF), electron energy distribution function (EEDF), ion directionality, and other plasma related characteristics. Waveform 225 is an example of a non-compensated pulsed voltage (PV) waveform established at the substrate 103 during plasma processing due to the delivery of a PV waveform provided to the bias electrode 104. The compensated pulsed voltage (PV) waveform seen at the substrate can alternatively be established by applying a negative voltage ramp to a PV waveform provided to the bias electrode 104 by a PV waveform generator 150 during the ion current stage of the pulsed voltage waveform.

In FIG. 2, waveform 225 includes two main stages: an ion current stage and a sheath collapse stage. Both portions (the ion current stage and the sheath collapse stage) of the waveform 225 can be established at the substrate 103 during plasma processing. At the beginning of the ion current stage, a drop in voltage at the substrate 103 is created, due to the delivery of a negative portion of a PV waveform (e.g., ion current portion) provided to the bias electrode 104 by PV waveform generator 150, which creates a high voltage sheath above the substrate 103. The high voltage sheath allows the plasma generated positive ions to be accelerated towards the biased substrate during the ion current stage, and thus, for RIE processes, controls the amount and characteristics of the etching process that occurs on the surface of the substrate during plasma processing. In some embodiments, it is desirable for the ion current stage to generally include a region of a pulsed voltage waveform that achieves a voltage at the substrate that is stable or minimally varying throughout the stage. One will note that significant variations in voltage established at the substrate during the ion current stage, such as shown by the positive slope in the waveform 225, will undesirably cause a variation in the ion energy distribution function (IEDF) and/or the electron energy distribution function (EEDF), and thus, cause undesirable characteristics of the etched features to be formed in the substrate during an RIE process.

A PV waveform generated by a PV waveform generator 150 may include a plurality of bursts (not shown). Each burst is made up of a pulsed voltage waveform that includes a plurality of voltage pulses. In some embodiments, the bias voltage is applied during the ion current stage of each voltage pulse. Stated otherwise the off-time of each voltage pulse $T_{OFF}$ occurs during the sheath collapse stage and the bias voltage is applied during the on-time $T_{ON}$, which occurs during the ion current stage. The on-time $T_{ON}$ and the off-time $T_{OFF}$ are configured as a percentage of a period $T_P$ of each voltage pulse. The frequency of each voltage pulse may be adjusted by increasing or decreasing $T_P$, while $T_{ON}$ and $T_{OFF}$ may be adjusted by changing their percentages of $T_P$. Furthermore, the voltage pulse has an applied voltage V that is defined as the peak voltage of the sheath collapse stage.

FIGS. 3A and 3B illustrate bursts of a PV waveform generated by a PV waveform generator delivered to a bias electrode, according to certain embodiments. A PV waveform generator 150 is configured to generate a PV waveform 301 comprising multiple bursts of voltage pulses that are based on information provided in a parameter of a synchronization signal 303, such as a TTL signal, provided by controller 126. In certain embodiments, each voltage pulse of the PV waveform 301 may be triggered by each pulse of the synchronization signal 303. The characteristics of the voltage pulses within a burst of voltage pulses generated by the PV waveform generator 150 are controlled by the synchronization signal 303. In some embodiments, at least one parameter of the voltage pulses within a burst are based on a parameter of the synchronization signal 303. In one example, a first burst 304a may be transmitted each time a PV waveform generator 150 receives a first waveform pulse 306a of synchronization signal 303. A second burst 304b may be transmitted each time a PV waveform generator 150 receives a second waveform pulse 306b.

In some embodiments, a burst is transmitted during each waveform pulse of the synchronization signal 303. At least one parameter of the voltage pulses that make-up each burst, such as the voltage pulse frequency, the pulse on-time, the pulse voltage, and combinations thereof may be based on a parameter of each waveform pulse of the synchronization signal 303. In some embodiments, to adapt to the variations in the IDEF, EEDF, and undesirable characteristics, such as non-uniformity of etched features across the substrate 103, a PV waveform generator 150 may be configured to deliver bursts with different parameters based on one or more characteristics of a synchronization signal received by a PV waveform generator 150 from the controller 126. Advantageously, it is believed that by controlling the characteristics of portions of the pulsed voltage waveform during different phases of plasma process performed on a substrate will allow for improved etched features to be formed across a surface of the substrate 103. For example, a higher voltage pulse frequency within a burst can result in a higher etch rate at the center portion 170 (FIG. 1) of the substrate 103 while a lower voltage pulse frequency during a burst can result in a higher etch rate at the edge portions 172 of the substrate 103. In another example, a longer pulse-on-time ($T_{ON}$) versus pulse off-time ($T_{OFF}$) can result in a higher etch rate on the edge portions 172 of the substrate 103 and a shorter pulse-on time results in a lower etch rate on the center portion 170 of the substrate 103. It has been found that the pulse-on-time and pulse frequency can affect other important plasma processing parameters, such as etch selectivity, bowing, and critical dimension. In another example, controlling the pulse voltage level, such as a higher voltage level in one phase of the plasma process versus another can result in an improved ability to etch deep features in a surface of the substrate, a higher etch rate and a larger plasma sheath (and vice versa for a voltage pulse repetition frequency), while lower voltage levels can be beneficially used for shaping the mask and top part of the etched feature. In another example, adjusting the rest time between bursts of voltage pulses can be used to provide an extra time for the etching by-products to be pumped out of the processing volume 129, which can improve etch uniformity, while a shorter rest time between bursts can improve substrate throughput during plasma processing. Therefore, in each of the methods described below, at least one parameter of the voltage pulse within different bursts within a PV waveform may be adjusted during processing to achieve a desired plasma processing result. The combinations of different bursts that have voltage pulses that have differing characteristics can be used tune the plasma processing results seen on a substrate.

At least one parameter of each voltage waveform within a burst may be based on a parameter of each waveform pulse of the synchronization signal. In one example, a PV waveform generator 150 may differentiate between voltage waveform parameters within a burst based on a portion of a waveform pulse of the synchronization signal 303. In one example, first waveform 306a of the synchronization signal 303 may have a first pulse voltage $V_{P1}$, and a second waveform 306b of the synchronization signal 303 may have a second pulse voltage $V_{P2}$ which is used to cause a change in one or more parameters of each of the voltage waveforms within each of the associated bursts. In one example, the first pulse voltage $V_{P1}$ may indicate to PV waveform generator 150 to generate a voltage waveform that has a first pulse frequency during the first burst 304a, and the second pulse voltage $V_{P2}$ may indicate to the PV waveform generator 150 to generate voltage waveform that has a second pulse frequency during the second burst 304b.

Stated otherwise, the first waveform pulse 306a may correspond to a first burst 304a having a voltage pulse frequency equal to a first voltage pulse frequency $F_1$, a pulse-on-time equal to $OT_1$, and a pulse voltage of $V_1$. The second waveform pulse 306b may correspond to a second burst 304b having a voltage pulse frequency equal to $F_2$, a pulse-on-time equal to $OT_2$, and a pulse voltage equal to $V_2$. Voltage pulse frequencies $F_1$ and $F_2$ may both include different voltage pulse frequencies between 25-500 kHz, pulse on times $OT_1$ and $OT_2$ may include different pulse on times between 10% and 90% of the voltage pulse period, and pulse voltages $V_1$ and $V_2$ may be pulse voltages between 500 V and 15 kV.

The parameter of each waveform pulse of the synchronization signal 303 may correspond to one, all of, or a combination of parameters that are applied to a voltage pulse within a burst. Furthermore, multiple synchronization signals that each correspond to different parameters of each burst may also be used to differentiate between the characteristics applied to each voltage pulse within a burst (FIG. 3D).

Advantageously, based on the etch recipe and desired etched features to be formed on the substrate 103, the synchronization signal 303 may be configured so that the parameters of the PV waveform 301 are changed during processing to achieve a desired etch profile across the substrate 103. Stated otherwise, although the waveform pulses alternate in FIG. 3A, the synchronization signal 303 may be configured to control the delivery of voltage pulses within each burst in any suitable order or arrangement to meet a desired etch profile.

Furthermore, the rest time between bursts of the PV waveform 301 may correspond to the rest time between waveform pulses of the synchronization signal 303. Generation of each burst of voltage pulses may be triggered by a rising edge of each waveform pulse of the synchronization signal 303. In some configurations, the falling edge of each waveform pulse may trigger the PV waveform generator 150 to cease generating a burst. For example, a first rest time 308a (FIG. 3A) between the first burst 304a and the second burst 304b is equal to the rest time between the first waveform pulse 306a and the second waveform pulse 306b of the synchronization signal 303. A second rest time 308b between the second burst 304b and the first burst 304a is equal to the rest time between the second waveform pulse 306b and the first waveform pulse 306a. In another example, as illustrated in FIG. 3B, the rest times between bursts may be eliminated by eliminating the rest time between the waveform pulses of the synchronization signal 303.

In certain embodiments, the voltage pulse frequency of each burst may be determined by a parameter of a corresponding waveform pulse of the synchronization signal 303. For example, the pulse voltage $V_{P1}$ of the first waveform pulse 306a may correspond to first frequency $F_1$ and the pulse voltage $V_{P2}$ of the second waveform pulse 306b may correspond to a second pulse frequency $F_2$. In other words, the information contained in the synchronization signal 303 can be used to set and/or adjust a characteristic of the voltage pulses, such as the voltage pulse repetition frequency.

Although two different bursts generated based on two different waveform pulses of the synchronization signal are illustrated in FIGS. 3A-3B, the number of different bursts having the same or different voltage pulse characteristics in each burst generated by the PV waveform generator 150, and the number of waveform pulses in each synchronization signals used to create the different bursts of voltage pulses are not intended to be limited by this disclosure. Also, the number of or shape of the synchronization signals used to control the PV waveform generator 150 pulses are not limited by this application. Each characteristic of each voltage waveform within a burst may be controlled by use of one or more synchronization signals. For example, different parameter(s) of the voltage waveforms that make up each burst may correspond to a pulse voltage level of each of the multiple synchronization signals, as will be described in more detail below.

Figure 3C:
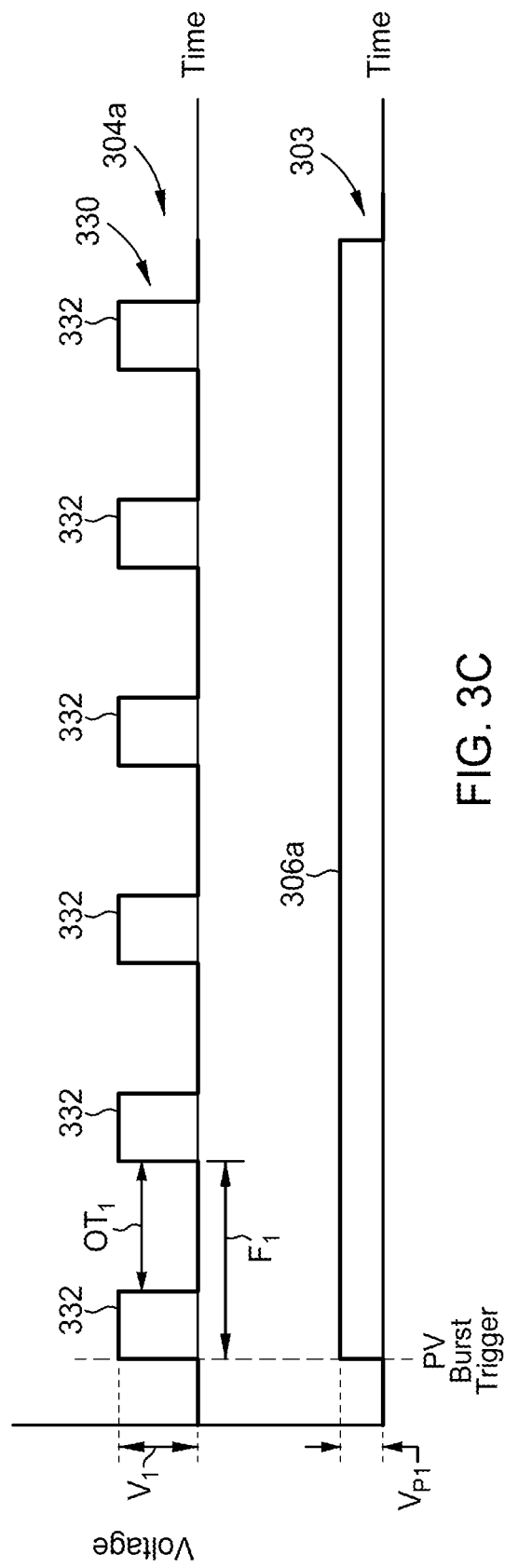
FIG. 3C illustrates an example of a pulsed voltage waveform that makes-up a burst of a PV waveform, according to certain embodiments.
Figure 3D:
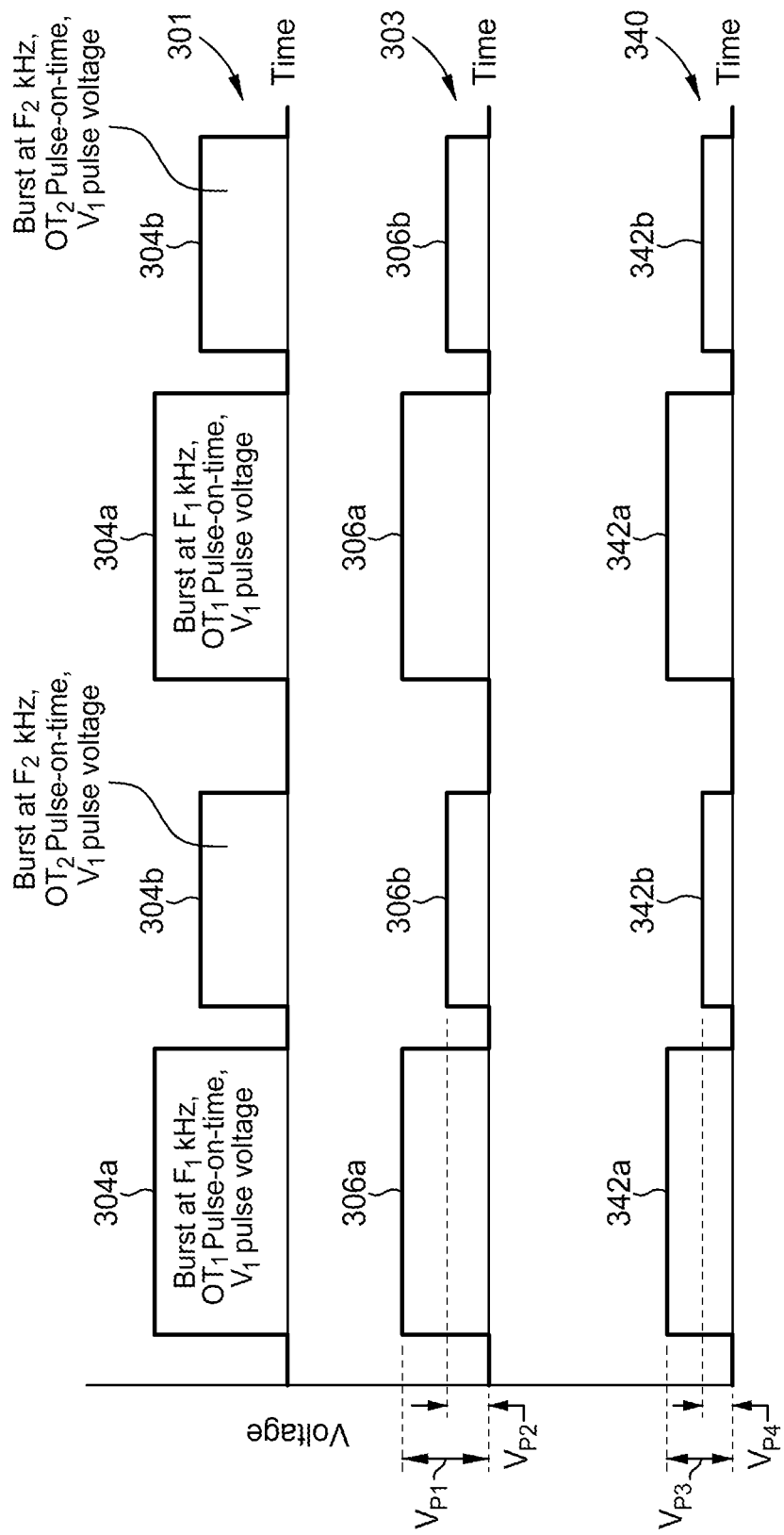
FIG. 3D illustrates a PV waveform generated by a PV waveform generator based on multiple synchronization signals, according to certain embodiments.

FIG. 3C illustrates an example of a pulsed voltage waveform that is made up of a plurality of voltage pulses 332 within a first burst 304a, according to certain embodiments. For example, FIG. 3C illustrates pulsed voltage waveform 330 that makes-up a first burst 304a that includes six voltage pulses 332 that each have a period "$T_P$", an on-time "$OT_1$", and an applied voltage "$V_1$". As explained above, the first burst 304a is generated during a first waveform pulse 306a of the synchronization signal 303. The pulsed voltage waveform 330 is generated in sync with the first waveform pulse 306a of the synchronization signal 303. Stated otherwise, a rising edge of the first waveform pulse 306a triggers generation of the pulsed voltage waveform 330 and the falling edge of the first waveform pulse 306a triggers PV waveform generator 150 to stop generating the pulsed voltage waveform 330.

The pulsed voltage waveform 330 includes a plurality of voltage pulses 332. The pulses 332 may include parameters such as a voltage pulse repetition frequency, pulse-on-time, and pulse voltage. Also, as explained above, a parameter of synchronization signal 303 (or multiple synchronization signals) corresponds to the setting of at least one parameter of the pulsed voltage waveform 330. For example, as described above the pulse voltage $V_{P1}$ of the first waveform pulse 306a corresponds to a voltage pulse frequency of $F_1$, a pulse on time of $OT_1$, and a pulse voltage of FIG. 3D illustrates a PV waveform 301 generated by a PV waveform generator based on multiple synchronization signals, according to certain embodiments. As explained above, multiple synchronization signals may be received by a PV waveform generator 150 and used to separately define one or more characteristics of the voltage pulses (not shown) within the PV waveform 301. Each of the synchronization signals may correspond to at least one parameter of each voltage pulse within a burst of voltage pulses with the PV waveform 301 transmitted by the PV waveform generator 150. In certain embodiments, each voltage pulse generated by the PV generator 150 may be triggered by each pulse of the synchronization signals.

Referring to FIG. 3D, the controller 126 may transmit a first synchronization signal 303 and a second synchronization signal 340, to a PV waveform generator 150. Both synchronization signals may each correspond to at least one parameter of each voltage pulse within a burst. For example, synchronization signal 303 may be a first synchronization signal and may include information that is used to control or adjust the voltage pulse frequency within each burst of voltage pulses. For example, when a first waveform pulse 306a of the first synchronization signal 303 has a first pulse voltage $V_{P1}$ level, and the PV waveform generator 150 uses or interprets the received first pulse voltage $V_{P1}$ level to require the delivery of voltage pulses at a frequency $F_1$ (i.e., $1/T_{p1}$). On the other hand, when a second waveform pulse 306b of the first synchronization signal 303 has a second pulse voltage $V_{P2}$ level, and the PV waveform generator 150 uses or interprets the received second pulse voltage $V_{P2}$ level to require the delivery of voltage pulses at a frequency $F_2$ (i.e., $1/T_{p2}$).

The second synchronization signal 340 may be used to control a separate voltage pulse characteristic or parameter, such as the pulse-on-time of each voltage pulse within each burst or pulse voltage level of each voltage pulse within each burst. For example, when a first waveform pulse 342a of the second synchronization signal 340 is equal to a third pulse voltage $V_{P3}$ level, the PV waveform generator 150 uses or interprets the received third pulse voltage $V_{P3}$ level of the second synchronization signal 340 to require the delivery of voltage pulses have a first pulse-on-time $O_{T1}$. When a second waveform pulse 342b of the second synchronization signal 340 is equal to a fourth pulse voltage $V_{P4}$ level, the PV waveform generator 150 uses or interprets the received fourth pulse voltage $V_{P4}$ level of the second synchronization signal 340 to require the delivery of voltage pulses that have a second pulse on-time $OT_2$.

Although each voltage waveform of each synchronization signal switches between two different voltage levels, each synchronization signal may switch between more than two different voltage levels that each correspond to additional values of the parameter(s) of voltage pulse in each burst. In one example, different voltage levels, voltage ramps or other pulse characteristics may be used in a synchronization waveform to adjust other voltage parameters of each delivered voltage pulse within a burst. Other voltage pulse parameters that can be adjusted based on information provided in the synchronization signal may include, but are not limited to, the slope of the applied voltage during a portion of voltage pulse and/or the magnitude and duration of the applied voltage during sub-portions of voltage pulse within a portion of voltage pulse delivered within a burst. In one example, the sub-portions can include a staircase like voltage signal delivered during one or more portions of the voltage pulses provided within a burst.

Furthermore, although two different synchronization signals are shown in FIG. 3D, more than two synchronization signals that are used to control at least one parameter of each voltage pulse within a burst may be used. In one example, a third synchronization may be used to control the applied pulse voltage of each voltage pulse within a burst. On the other hand, the pulse voltages of the voltage waveforms of the first synchronization signal 303 or the second synchronization signal 340 may additionally be used to control the applied voltage of the voltage pulses within a burst. For example, the first waveform pulse 342a of the second synchronization signal 340 having a third pulse voltage $V_{P3}$ may correspond to the first burst 304a having a first pulse voltage $V_1$, and the second waveform pulse 342b of the second synchronization signal 340 having a fourth pulse voltage $V_{P4}$ may correspond to a second burst having a pulse voltage of $V_2$. Alternatively, in certain embodiments, the controller 126 may communicate the parameters of each etch recipe step to a central controller of the PV waveform generator 150. Some or all of the parameters, such as the pulse voltage, pulse-on time, or the pulse frequency can be controlled by controller 126. Stated differently, each step of the processing recipe may be controlled, either by a combination, or one, of the synchronization signal(s) or the controller 126.

Figure 4:
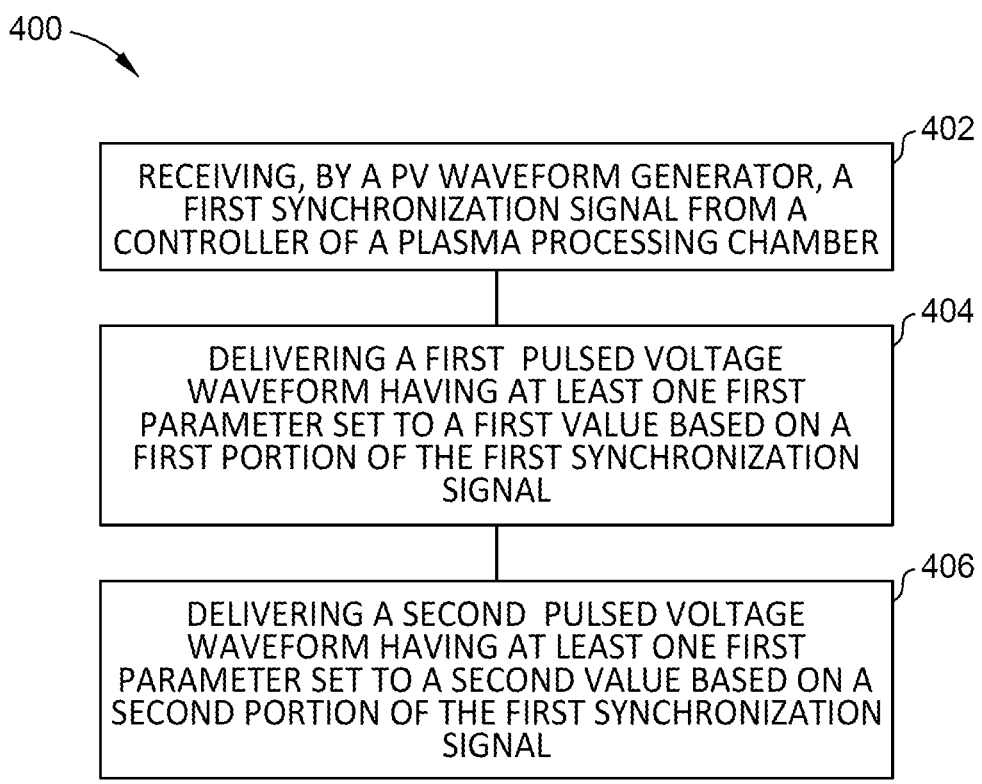
FIG. 4 illustrate methods of using a plasma processing chamber according to certain embodiments.

FIG. 4 illustrates a method 400 of using a plasma processing chamber (e.g., plasma processing chamber 100 FIG. 1) according to certain embodiments. Method 400 is performed by processing logic that include hardware (e.g., circuitry, dedicated logic, programmable logic, microcode, processing device, etc.), software (such as instructions run on a processing device, a general purpose computer system, or a dedicated machine), firmware, microcode, or a combination thereof. In some embodiments, method 400 is performed, in part, by a controller device (e.g., system controller 126 of FIG. 1). In some embodiments, a non-transitory storage medium stores instructions that when executed by a processor in the controller device cause the controller device to perform method 400.

For simplicity of explanation, method 400 is depicted and described as a series of operations. However, operations in accordance with this disclosure can occur in various orders and/or concurrently and with other operations not presented and described herein. Furthermore, in some embodiments, not all illustrated operations are be performed to implement method 400 in accordance with the disclosed subject matter. In addition, those skilled in the art will understand and appreciate that method 400 could alternatively be represented as a series of interrelated states via a state diagram or events.

At block 402 of method 400, as shown in FIGS. 3A-3C, a first synchronization signal 303 is received by a PV waveform generator 150. The first synchronization signal is transmitted from a controlling device, such as the controller 126 of the plasma processing chamber 100.

At block 404 of method 400, as shown in FIGS. 3A-3C, a PV waveform generator 150 delivers a first series of voltage pulses (i.e., first burst) to a biasing electrode of substrate assembly 136 based on synchronization signal 303. As explained above, a parameter or characteristic of a first waveform pulse 306a is used by the PV waveform generator 150 to control at least one parameter of a first series of voltage pulses that make-up a first burst 304a. The pulse voltage $V_{P1}$ of the first waveform pulse 306a may be used by the PV waveform generator 150 to control, one of, a combination of, or all of the parameters of the waveform characteristics of voltage pulses within the first burst 304a. For example, the one or more characteristics of the first waveform pulse 306a may be used by the PV waveform generator 150 to deliver voltage pulses within the first burst 304a that have a pulse frequency of $F_1$, a pulse-on-time of $O_{T1}$, and a pulse voltage $V_1$. In some cases, a single characteristic of the of the first waveform pulse 306a is used to control one of the characteristics of the voltage pulses within the voltage waveform 301, such as the first voltage level $V_{P1}$ of the first waveform pulse 306a is used to control the applied pulse voltage $V_1$ during the duration of the first burst 304a, while the other characteristics of the voltage pulses within the voltage waveform 301 are set and controlled by pre-configured system constants that are stored in memory of the PV waveform generator 150 or system controller.

At block 406 of method 400, as shown in FIG. 3A, a PV waveform generator 150 delivers a second series of voltage pulses during burst 304b based on a second waveform pulse 306b of synchronization signal 303. As explained above, a parameter of the second waveform pulse 306b may correspond to at least one parameter of a second series of voltage pulses that make-up the second burst 304b. The pulse voltage $V_{P2}$ of the second waveform pulse 306b may correspond to, one of, a combination of, or all of the parameters or characteristics of the voltage pulses provided during the second burst 304b. For example, the second waveform pulse 306b may result in the voltage pulses within the second burst 304b having at least one different characteristic from the voltage pulses provided during burst 304a, such as a burst frequency $F_2$, a pulse on time of $OT_2$, and/or a pulse voltage $V_2$. This process may be repeated for each burst of the PV waveform 301.

Advantageously, parameters of voltage pulse within each burst of the PV waveform may be changed during plasma processing to achieve a desired result. For example, alternatively or additionally to changing other parameters, the pulse frequency may be changed from $F_1$ to $F_2$ between the first burst 304a and the second burst 304b. For example, a higher pulse frequency can result in a higher etch uniformity at the center portion 170 of the substrate 103. Whereas a lower pulse frequency can result in a higher etch uniformity at edge portions of the substrate 103. Therefore, the pulse frequency can be changed during plasma processing to achieve a desired etch profile.

However, as explained above, the PV waveform 301 is not limited to two different bursts and the synchronization signal 303 is not limited to two waveform pulses. Furthermore, the synchronization signal 303 may be used to control one of, all of, or a combination of parameters of each voltage pulse within a burst.

Figure 5:
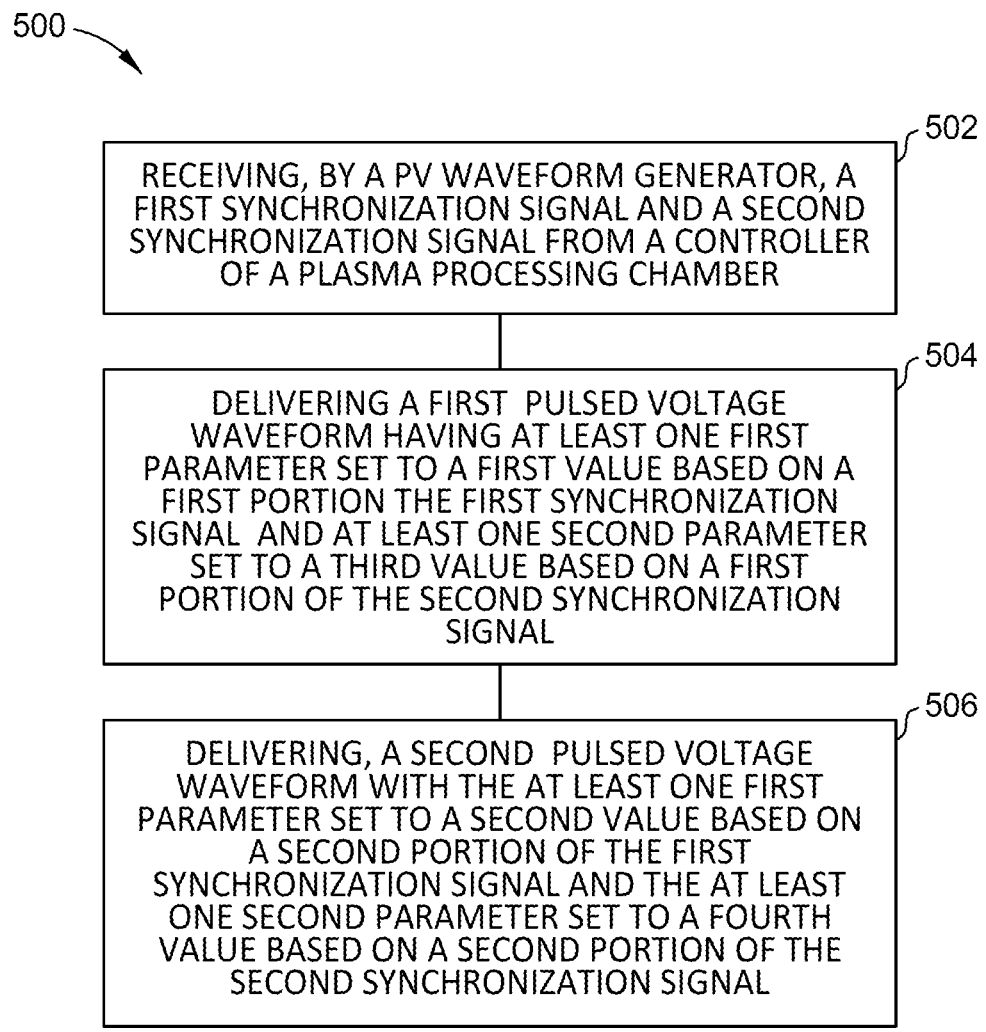
FIG. 5 illustrates methods of using a plasma processing chamber according to certain embodiments.

FIG. 5 illustrates a method 500 of performing a plasma process in a plasma processing chamber (e.g., plasma processing chamber 100 FIG. 1), according to certain embodiments. Method 500 is performed by processing logic that include hardware (e.g., circuitry, dedicated logic, programmable logic, microcode, processing device, etc.), software (such as instructions run on a processing device, a general purpose computer system, or a dedicated machine), firmware, microcode, or a combination thereof. In some embodiments, method 500 is performed, in part, by a controller device (e.g., system controller 126 of FIG. 1). In some embodiments, a non-transitory storage medium stores instructions that when executed by the controller device cause the controller device to perform method 500.

For simplicity of explanation, method 500 is depicted and described as a series of operations. However, operations in accordance with this disclosure can occur in various orders and/or concurrently and with other operations not presented and described herein. Furthermore, in some embodiments, not all illustrated operations are be performed to implement method 500 in accordance with the disclosed subject matter. In addition, those skilled in the art will understand and appreciate that method 500 could alternatively be represented as a series of interrelated states via a state diagram or events.

At block 502 of method 500, as shown in FIG. 3D, a first synchronization signal 303 and a second synchronization signal 340 are generated by a controller and received by a PV waveform generator 150. In some embodiments as shown, the synchronization signals are in sync with one another and can be transmitted from the controller 126 of the plasma processing chamber 100.

At block 504 of method 500, as shown in FIG. 3D, a PV waveform generator 150 delivers a first pulsed voltage waveform that includes a first burst 304a based on the receipt of the first synchronization signal 303 and the second synchronization signal 340. For example, at least one first parameter of the first voltage pulses which make-up a first burst 304a may be derived from a first value of a parameter of the first waveform pulse 306a of the first synchronization signal 303. At least one second parameter of the first voltage pulses may be derived from a third value of a parameter of the first waveform pulse 342a of the second synchronization signal 340. For example the voltage $V_{P1}$ of the first waveform pulse 306a is used by the PV waveform generator 150 to decide to deliver a plurality of voltage pulses at a first frequency $F_1$, and the voltage $V_{P3}$ of the first waveform pulse 342a of the synchronization signal 340 is be used by the PV waveform generator 150 to decide to deliver the plurality of voltage pulses that have a pulse-on-time equal to $OT_1$.

At block 506 of method 500, as shown in FIG. 3D, a PV waveform generator 150 delivers a second series of voltage pulses (i.e., a second burst 304b) based on the first synchronization signal 303 and the second synchronization signal 340. For example, at least one first parameter of the second voltage pulses which make-up a first burst 304a may be derived from a second value of a parameter of the second waveform pulse 306b of the first synchronization signal 303. At least one second parameter of the first voltage pulses may be derived from a fourth value of a parameter of the second waveform pulse 342b of the second synchronization signal 340. For example, the voltage $V_{P2}$ of the second waveform pulse 306b of the first synchronization signal 303 is used by the PV waveform generator 150 to deliver the plurality of voltage pulses that have a pulse frequency equal to $F_2$, and the voltage $V_{P4}$ of the second waveform pulse 342b is used by the PV waveform generator 150 to deliver the plurality of voltage pulses that have a pulse-on-time equal to $OT_2$.

Advantageously, multiple parameters of the voltage pulses within each burst of the PV waveform may be changed during plasma processing to achieve a desired result. Alternatively or additionally to changing other parameters, the pulse-on-time may be changed between bursts. A longer pulse-on-time can result in a higher etch rate on the edge portions 172 of the substrate 103 and a shorter pulse-on time results in a lower etch rate on the center portion 170 of the substrate 103. For example, the pulse-on-time may be changed from $OT_1$ to $OT_2$ between the first burst 304a and the second burst 304b and thus an averaging or blending of the process results from each pulse on-time setting in each burst or portion of a burst can be used to achieve improved process results. Therefore, in one example, the pulse-on-time (and/or any other parameters) can be changed during plasma processing to achieve a desired center to edge etch profile.

FIGS. 6A and 6B each illustrate an example of a pulsed voltage waveform 610 that is delivered to a bias electrode and a synchronization signals 602 delivered to a PV waveform generator during plasma processing, according to certain embodiments. In certain embodiments, the synchronization signal 602 may signal to the PV waveform generator 150 to adjust at least one parameter or characteristic of the voltage waveform 610 between a first set of at least two different values of a waveform pulse and adjust the at least one parameter between a second set of at least two different values after receiving the synchronization waveform pulse.

In one example, a synchronization signal 602, such as a TTL signal, may comprise a plurality of waveform pulses 604 that are separated by periods of a different synchronization signal voltage level (i.e., regions 611). A parameter of a rising edge 606 of each waveform pulse 604 may trigger a PV waveform generator 150 to adjust at least one parameter or characteristic of the pulsed voltage waveform 610 between a first set of values during each of the waveform pulses 604 of the synchronization signal 602. For example, a rising edge 606 of the synchronization signal 602 having a first voltage $V_{P1s}$ triggers a PV waveform generator 150 to adjust the applied pulse voltage of the pulsed voltage waveform 610 between a first set of values comprising a first voltage $V_{1a}$ and a second voltage $V_{1b}$. In one example, as shown, the rising edge 606 causes the PV waveform generator 150 to serially deliver first voltage pulses 621 and second voltage pulses 622 for the length of the period of the waveform pulse 604, and thus forming a first burst of voltage pulses. A falling edge 608 of each waveform pulse 604 may trigger a PV waveform generator 150 to alternate the applied pulse voltage of the pulsed voltage waveform 610 in a second set of serially delivered third voltage pulses 623 and fourth voltage pulses 624 that vary between a second set of values comprising a third voltage $V_{2a}$ and a fourth voltage $V_{2b}$. In some configurations, the PV waveform generator 150 may cause an adjustment to the second set of voltage pulse parameters after receiving a change in a parameter of the synchronization signal 602, such as the rising edge or falling edge. In one example, a change in a parameter of the synchronization signal 602 can include a difference in the slope of the rising edge or the falling edge of the synchronization signal. In this case, the change in a parameter of the synchronization signal 602 can cause a preset number of pulses to be delivered based on the change in the synchronization signal 602 versus continuing to deliver the plurality of pulses while the synchronization is maintained in a single state (e.g., maintained at $V_{P1s}$) for a period of time. The number of pulses of voltage pulses generated after the rising time in the synchronization signal is generated or after the falling time is generated may or may not be equal and may be controlled by system constants and/or algorithm stored in memory of the PV waveform generator 150 or system controller. This will at least allow for the control over complex voltage pulse delivery schemes and rest times (i.e., portion 628 of the pulsed voltage waveform 610) formed between bursts of voltage pulses and ensures that a PV waveform generator 150 is not required to deliver or receive the synchronization signal 602 all the time to control the characteristics of the pulsed voltage waveform 610.

Although FIG. 6A illustrates a synchronization signal 602 that causes a PV waveform generator 150 to adjust a parameter between two sets of two voltage pulse values, the number of sets of values and/or number of values in each set of values are not limited. Also each set of values may have equal or unequal quantities of values. Also, although synchronization signal 602 corresponds to one parameter of a pulsed voltage waveform 610, synchronization signal 602 may correspond to more than one parameter of the pulsed voltage waveform 610.

FIG. 6B illustrates a pulsed voltage waveform 610 that includes multiple parameters, which as shown may, for example, that include portions that vary in a cyclic manner, based on a characteristic of a provided synchronization signal 602. In certain embodiments, multiple parameters of the pulsed voltage waveform 610 may be adjusted between different sets of values based on a single synchronization signal 602. For example, the pulse voltage may adjust between a first set of values, and the pulse-on-time may adjust between a third set of values based on a rising edge 606. The pulse voltage may adjust between a second set of values and the pulse on-time may adjust between a fourth set of values based on a falling edge 608.

For example, as illustrated in FIG. 6B, the first pulse voltage $V_{P1s}$ of rising edge 606 of synchronization signal 602 may cause a PV waveform generator 150 to adjust the pulsed voltage waveform 610 between the first set of values described above, and adjust the pulse-on-time between a third set of values comprising a first pulse-on-time T1a and a second pulse-on-time T1b for each of a plurality of voltage pulses 621 and 622. The falling edge 608 of the synchronization signal 602 cause the PV waveform generator 150 to adjust the pulsed voltage waveform 610 between the second set of values described above, and adjust the pulse-on-time between a fourth set of values comprising a third pulse-on-time T2a and a fourth pulse-on-time $T_{2b}$ for each of a plurality of voltage pulses 623 and 624 for a predetermined pulse count.

Figure 6C:
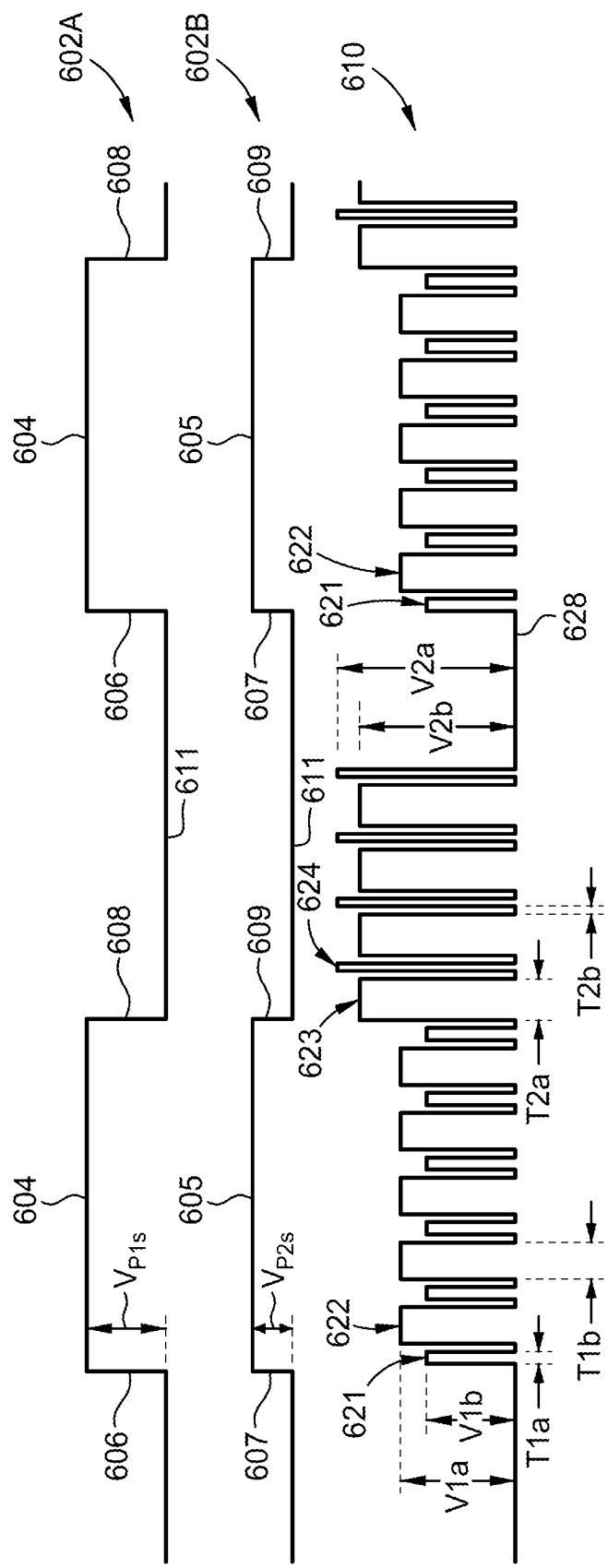
FIG. 6C illustrates an example asymmetric pulsed voltage that are delivered to a substrate assembly and synchronization signals delivered to a PV waveform generator according to certain embodiments.

FIG. 6C illustrates an example pulsed voltage that are delivered to a substrate assembly and synchronization signals delivered to a PV waveform generator according to certain embodiments. FIG. 6C illustrates multiple synchronization signals that each corresponds to at least one parameter of a pulsed voltage waveform 610 that may be used by the PV waveform generator 150 to adjust between different sets of values of voltage pulses formed therein. A first synchronization signal 602A may be used to cause the PV waveform generator 150 to adjust the voltage pulse of the pulsed voltage waveform 610 in the same manner described in FIG. 6A. The first synchronization signal 602A is similar to synchronization signal 602.

In one example, a second synchronization signal 602B, comprising a plurality of waveform pulses 605 may also be received by the PV waveform generator 150. The second synchronization signal 602B may be synchronized with the first synchronization signal 602A. A parameter such as a pulse voltage of a rising edge 607 of the second synchronization signal 602B may trigger the PV waveform generator 150 to adjust a different at least one parameter of pulsed voltage waveform 610 between a third set of values. For example, a rising edge 607 of the second synchronization signal 602B having a second voltage $V_{P2s}$ triggers the PV waveform generator 150 to alternate the pulse-on-time of the voltage pulses between the third set of values described above. A falling edge 609 of the second synchronization signal 602B may trigger the PV waveform generator 150 to alternate the pulse-on-times between the fourth set of values described above for a predetermined pulse count.

Figure 7:
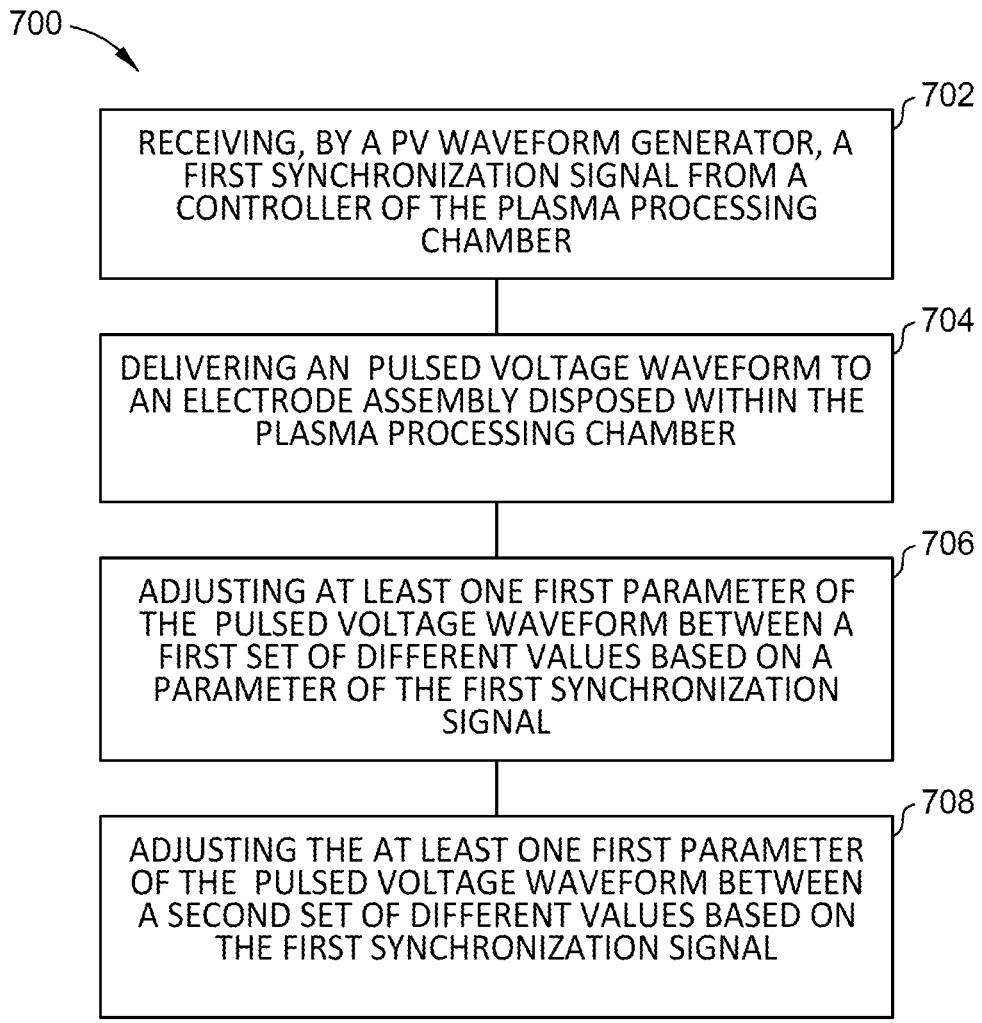
FIG. 7 illustrates methods of using a plasma processing chamber according to certain embodiments.

FIG. 7 illustrates a method 700 of using a plasma processing chamber (e.g., plasma processing chamber 100 FIG. 1) according to certain embodiments. Method 700 is performed by processing logic that include hardware (e.g., circuitry, dedicated logic, programmable logic, microcode, processing device, etc.), software (such as instructions run on a processing device, a general purpose computer system, or a dedicated machine), firmware, microcode, or a combination thereof. In some embodiments, method 700 is performed, in part, by a controller device (e.g., system controller 126 of FIG. 1). In some embodiments, a non-transitory storage medium stores instructions that when executed by the controller device cause the controller device to perform method 700.

For simplicity of explanation, method 700 is depicted and described as a series of operations. However, operations in accordance with this disclosure can occur in various orders and/or concurrently and with other operations not presented and described herein. Furthermore, in some embodiments, not all illustrated operations are be performed to implement method 700 in accordance with the disclosed subject matter. In addition, those skilled in the art will understand and appreciate that method 700 could alternatively be represented as a series of interrelated states via a state diagram or events.

At block 702 of method 700, as shown in FIG. 6A, a synchronization signal 602 is received by PV waveform generator 150. In some embodiments, the synchronization signal 602 is transmitted from the system controller 126 of the plasma processing chamber 100.

At block 704 of method 700, as shown in FIG. 6A, a pulsed voltage waveform 610 is delivered by a PV waveform generator 150, to a bias electrode of substrate assembly 136 disposed within the plasma processing chamber 100. As will be described in the steps below, PV waveform generator 150 may be configured to serially deliver a plurality of voltage pulses.

At block 706 of method 700, as shown in FIG. 6A, a PV waveform generator 150 adjusts at least one parameter or characteristic of the pulsed voltage waveform 610 between a first set of at least two different values of a voltage pulse based on a parameter of a rising edge 606 of each waveform pulse 604 the synchronization signal 602. As illustrated in FIG. 6A, a first pulse voltage $V_{P1s}$ of a rising edge 606 of waveform pulses 604 of the synchronization signal 602 causes a PV waveform generator 150 to deliver a plurality of voltage pulses of the pulsed voltage waveform 610 that have a first set of values. In this example, the PV waveform generator 150 serially delivers first voltage pulses 621 and second voltage pulses 622 for the length of the period of the waveform pulse 604, and thus forming a first burst of voltage pulses. In some embodiments, the PV waveform generator 150 continues delivering voltage pulses that have at least one parameter that varies between a first set of values until a falling edge 608 of the waveform pulse 604.

At block 708 of method 700, as shown in FIG. 6A, a PV waveform generator 150 delivers voltage pulses that have a second set of values based on the receipt of a falling edge 608 of the waveform pulse 604 of the synchronization signal 602. As illustrated in FIG. 6A, the falling edge 608 of waveform pulse 604 of the synchronization signal 602 causes a PV waveform generator 150 to adjust the pulse voltage of the voltage waveform between a second set of values. In this example, the PV waveform generator 150 serially delivers third voltage pulses 623 and fourth voltage pulses 624, and thus forming a second burst of voltage pulses. In some embodiments, the PV waveform generator 150 continues adjusting between the at least one parameter between the second set of values until the number of pulses is equal to a predetermined pulse count.

Although FIG. 7 describes adjusting a single parameter of the voltage pulses between two different sets of values based on a synchronization signal, multiple parameters may be adjusted between different sets of values based on a single synchronization signal, as illustrated in FIG. 6B.

Advantageously, parameters of the pulsed voltage waveform 610 may be changed during plasma processing to achieve a desired result. For example, alternatively or additionally to changing other parameters, the pulse voltage of the voltage pulses may be changed. As explained above, a higher pulse voltage can result in an improved ability to etch deep features in a surface of the substrate, a higher etch rate, and a larger plasma sheath. Whereas lower pulse voltages can be beneficially used for forming certain types of etched features. Thus, the pulse voltages of bursts may be increased/decreased during plasma processing based on the etched features being formed. The pulse voltage may be changed in addition or alternatively to other parameters of the pulsed voltage waveform 610 such as the pulse frequency or the pulse-on-time.

Figure 8:
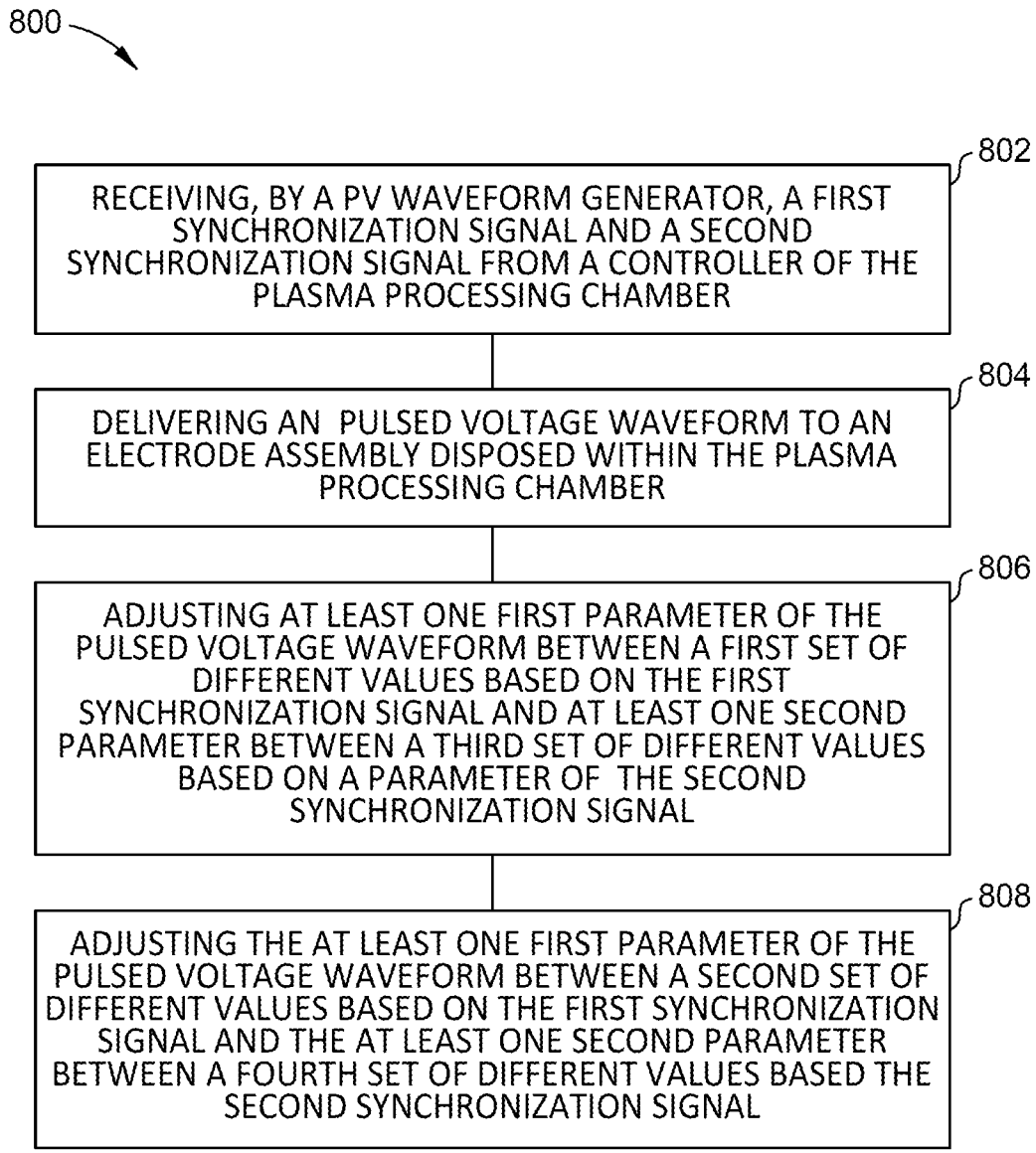
FIG. 8 illustrates methods of using a plasma processing chamber according to certain embodiments To facilitate understanding, identical reference numerals have been used, where possible, to designate identical elements that are common to the FIGURES. It is contemplated that elements and features of one embodiment may be beneficially incorporated in other embodiments without further recitation.

FIG. 8 illustrates a method 800 of using a plasma processing chamber (e.g., plasma processing chamber 100 FIG. 1) according to certain embodiments. Method 800 is performed by processing logic that include hardware (e.g., circuitry, dedicated logic, programmable logic, microcode, processing device, etc.), software (such as instructions run on a processing device, a general purpose computer system, or a dedicated machine), firmware, microcode, or a combination thereof. In some embodiments, method 800 is performed, in part, by a controller device (e.g., system controller 126 of FIG. 1). In some embodiments, a non-transitory storage medium stores instructions that when executed by the controller device cause the controller device to perform method 800.

For simplicity of explanation, method 800 is depicted and described as a series of operations. However, operations in accordance with this disclosure can occur in various orders and/or concurrently and with other operations not presented and described herein. Furthermore, in some embodiments, not all illustrated operations are be performed to implement method 800 in accordance with the disclosed subject matter. In addition, those skilled in the art will understand and appreciate that method 800 could alternatively be represented as a series of interrelated states via a state diagram or events.

At block 802 of method 800, as shown in FIG. 6C, a first synchronization signal 602A and a second synchronization signal 602B are received by a PV waveform generator 150. In some embodiments, the synchronization signals are transmitted from controller 126 of the plasma processing chamber 100.

At block 804 of method 800, as shown in FIG. 6C, a pulsed voltage waveform 610 is delivered by the PV waveform generator 150, to a bias electrode of substrate assembly 136 disposed within the plasma processing chamber 100.

At block 806 of method 800, as shown in FIG. 6C, a PV waveform generator 150 adjusts at least one first parameter of the pulsed voltage waveform 610 between a first set of values based on a parameter of a rising edge 606 of each waveform pulse the first synchronization signal 602A. Also, the PV waveform generator 150 adjusts at least one second parameter of the pulsed voltage waveform 610 between a third set of values based on a parameter of a rising edge 607 of each waveform pulse of the second synchronization signal 602B.

As illustrated in FIG. 6C, a first pulse voltage $V_{P1s}$ of a rising edge 606 of waveform pulses 604 of the first synchronization signal 602A causes the PV waveform generator 150 to adjust the pulse voltage of the voltage pulses between a first set of values. In this example, the PV waveform generator 150 continues adjusting between the first set of values until falling edge 608 of the waveform pulses 604. A second pulse voltage $V_{P2s}$ of a rising edge 607 of waveform pulses 605 the second synchronization signal 602B causes a PV waveform generator 150 to adjust the pulse-on-time of the voltage pulses between a third set of values until a falling edge 609 of the waveform pulses 605 of the second synchronization signal 602B. In this example, the PV waveform generator 150 serially delivers first pulses 621 and second voltage pulses 622, and thus forming a first burst of voltages. The first pulses 621 may have a voltage $V_{1a}$ and pulse-on time Tia based on a rising edge 606 of the first synchronization signal 602A. The second pulses 622 may have a voltage $V_{1b}$ and pulse-on time $T_{1b}$ based on a rising edge 607 of the second synchronization signal 602B.

At block 808 of method 800, as shown in FIG. 6C, a PV waveform generator 150 adjusts the at least one first parameter of the pulsed voltage waveform 610 between a second set of values based on the falling edge 608 of the waveform pulses 604 of the first synchronization signal 602A. Also, the PV waveform generator 150 adjusts the at least one second parameter of the pulsed voltage waveform 610 between a fourth set of values based on the falling edge 609 of each waveform pulse 605 of the second synchronization signal 602B.

As illustrated in FIG. 6C, a falling edge 608 of waveform pulses 604 of the first synchronization signal 602A causes the PV waveform generator 150 to adjust the pulse voltage of the voltage waveform between the third set of values for a predetermined pulse count. A falling edge 609 of waveform pulses 605 of the second synchronization signal 602B causes the PV waveform generator 150 to adjust the pulse-on-time of the voltage pulses between the fourth set of values for a predetermined pulse count. In this example, the PV waveform generator 150 serially delivers third voltage pulses 623 and fourth voltage pulses 624, and thus forming a second burst of voltages. The third voltage pulses 623 may have a voltage $V_{2a}$ and pulse-on time $T_{2a}$ based on a falling edge 608 of the first synchronization signal 602A. The fourth voltage pulses 624 may have a voltage $V_{2b}$ and pulse-on time $T_{2b}$ based on a falling edge 609 of the second synchronization signal 602B. As explained above, in some embodiments, the PV waveform generator 150 continues adjusting between the at least one parameter between the second set of values until the number of pulses is equal to a predetermined pulse count.

As explained above, the delivery and control of parameters or characteristics of a PV waveform delivered by PV waveform generator 150 may be controlled (i.e. changed) at different times during a plasma process to improve the plasma processing results achieved on a substrate. In various embodiments, at least one parameter of a PV waveform may be controlled via synchronization signal(s) received by PV waveform generator 150. Thus, allowing for better control over plasma processing results. For example, at least one parameter of synchronizations signal(s) delivered to the PV waveform generator 150 may be changed during plasma processing to change at least one parameter of a delivered PV waveform to better achieve a desired etch profile.

While the foregoing is directed to embodiments of the present disclosure, other and further embodiments of the disclosure may be devised without departing from the basic scope thereof, and the scope thereof is determined by the claims that follow.

What is claimed is:

1. A method for processing a substrate in a plasma processing system, the method comprising:
   receiving, by a waveform generator, a first synchronization waveform signal from a controller;
   delivering, by the waveform generator, a first burst of first voltage pulses to an electrode assembly disposed within the plasma processing system after receiving a first portion of the first synchronization waveform signal, wherein
   at least one first parameter of the first voltage pulses is set to a first value based on a first waveform parameter within the first portion of the first synchronization waveform signal; and
   delivering, by the waveform generator, a second burst of second voltage pulses to the electrode assembly disposed within the plasma processing system after receiving a second portion of the first synchronization waveform signal, wherein
   the at least one first parameter of the first voltage pulses is set to a second value based on a difference in the first waveform parameter within the second portion of the first synchronization waveform signal.

2. The method of claim 1, wherein the first portion and second portion of the first synchronization waveform signal each comprise a synchronization waveform pulse.

3. The method of claim 2, wherein setting the second value based on the difference in value of the first waveform parameter of the first portion and the second portion of the first synchronization waveform signal is based on a difference in a first characteristic of the synchronization waveform pulses.

4. The method of claim 3, wherein the first characteristic of the synchronization waveform pulses comprises a difference in a voltage level of the synchronization waveform pulse during the first portion and the second portion of the first synchronization waveform signal.

5. The method of claim 1, wherein a value of at least one second parameter of the first voltage pulses and the second voltage pulses are the same during the delivery of the first portion and second portion of the first synchronization waveform signal.

6. The method of claim 1, wherein the first portion of the first synchronization waveform signal and the second portion of the first synchronization waveform signal further comprise:
   a second waveform parameter that is configured to provide information that is used to adjust a second parameter of the first voltage pulses and the second voltage pulses; and
   a third waveform parameter that is configured to provide information that is used to adjust a third parameter of the first voltage pulses and the second voltage pulses.

7. The method of claim 6, wherein:
the first parameter, second parameter and third parameter of the first voltage pulses and the second voltage pulses are selected from a group consisting of pulse frequency, pulse-on-time and pulse voltage.

8. The method of claim 1, further comprising:
delivering by the waveform generator, a third burst of the first voltage pulses after receiving a third portion of the first synchronization waveform signal, wherein the third portion is identical to the first portion; and
delivering by the waveform generator, a fourth burst of the second voltage pulses after receiving a fourth portion of the first synchronization waveform signal, wherein the fourth portion is identical to the second portion.

9. The method of claim 1, wherein the first parameter of the first voltage pulses and the first parameter of the second voltage pulses are selected from a group consisting of pulse frequency, pulse-on time, voltage, or rest time, or combinations thereof.

10. The method of claim 1, wherein the first portion of the first synchronization waveform signal comprises a rising edge of a first waveform pulse of the first synchronization waveform signal, and the second portion of the first synchronization waveform signal comprises a rising edge of a second waveform pulse of the first synchronization waveform signal.

11. The method of claim 10, wherein the first waveform parameter of the first portion of the first synchronization waveform signal comprises a slope of the rising edge of the first waveform pulse of the first synchronization waveform signal and the first waveform parameter of the second portion of the first synchronization waveform signal comprises a slope of the rising edge of the second waveform pulse of the first synchronization waveform signal.

12. The method of claim 10, further comprising stopping delivery of the first voltage pulses based on a falling edge of the first waveform pulse of the first synchronization waveform signal.

13. The method of claim 10, further comprising delivering a third burst of third voltage pulses, based on a falling edge the first synchronization waveform signal, wherein at least one third parameter of the third voltage pulses is set to a third value based on the falling edge the first synchronization waveform signal.

14. The method of claim 1, further comprising:
delivering, by the waveform generator, a third burst of third voltage pulses after receiving a third portion of the first synchronization waveform signal, wherein a first parameter of the third voltage pulses is set to a third value based on a waveform parameter of the third portion of the first synchronization waveform signal; and
delivering, by the waveform generator, a fourth burst of fourth voltage pulses after receiving a fourth portion of the first synchronization waveform signal, wherein a first parameter of the fourth voltage pulses is set to a fourth value based on a waveform parameter of the fourth portion of the first synchronization waveform signal, and the first parameter of each of the voltage pulses are the same parameters.

15. The method of claim 1, further comprising:
receiving, by the waveform generator, a second synchronization waveform signal from the controller of the plasma processing system while the waveform generator receives the first synchronization waveform signal, wherein the at least one first parameter of the first voltage pulses is based on a waveform parameter of the first portion of the first synchronization waveform signal, and at least one second parameter of the first voltage pulses is determined based on a waveform parameter of a first portion of the second synchronization waveform signal.

16. A method for processing a substrate in a plasma processing system, the method comprising:
receiving, by a waveform generator, a first synchronization waveform signal from a controller of the plasma processing system;
delivering a first burst of first voltage pulses, by the waveform generator, to an electrode assembly disposed within the plasma processing system based on a first waveform pulse provided within the first synchronization waveform signal; and
adjusting, by the waveform generator, at least one first parameter of the first voltage pulses between a first set of values based on a characteristic of the first waveform pulse provided within the first synchronization waveform signal and a second set of values based on a characteristic of the first waveform pulse provided within the first synchronization waveform signal.

17. The method of claim 16, wherein, the at least one first parameter is selected from a group consisting of pulse frequency, pulse-on time, and pulse voltage.

18. The method of claim 16, further comprising:
adjusting, by the waveform generator, at least one second parameter of the first voltage pulses between a third set of values and a fourth set of values based on a characteristic of the first waveform pulse of the first synchronization waveform signal during the delivering of the first pulsed voltage waveform.

19. The method of claim 16, further comprising:
receiving, by a waveform generator, a second synchronization signal from the controller of the plasma processing system while the waveform generator receives the first synchronization waveform signal; and
adjusting, by the waveform generator, at least one second parameter of the first voltage pulses between a third set of different values and a fourth set of values based on a characteristic of a first waveform pulse of the second synchronization signal during the delivering of the first pulsed voltage waveform.

20. The method of claim 16, further comprising:
receiving, by the waveform generator, a second synchronization waveform signal from the controller of the plasma processing system;
delivering a second burst of second voltage pulses, by the waveform generator, to an electrode assembly disposed within the plasma processing system based on a first waveform pulse provided within the second synchronization waveform signal; and
adjusting, by the waveform generator, at least one first parameter of the second voltage pulses between a second set of values based on a characteristic of the first waveform pulse provided within the second synchronization waveform signal and a second set of values based on a characteristic of the first waveform pulse provided within the second synchronization waveform signal.

21. A plasma processing chamber comprising:
a voltage waveform generator configured to deliver a first pulsed voltage waveform to an electrode assembly disposed within the plasma processing chamber;

a controller; and a memory for storing a program to be executed in the controller, the program comprising instructions when executed cause the voltage waveform generator to:

receive a first synchronization waveform signal from the controller;

deliver the first burst of first voltage pulses to the electrode assembly disposed within the plasma processing system after receiving a first portion of the first synchronization waveform signal, wherein at least one first parameter of the first voltage pulses is set to a first value based on a parameter of the first portion of the first synchronization waveform signal; and deliver a second burst of second voltage pulses to the electrode assembly disposed within the plasma processing system after receiving a second portion of the first synchronization waveform signal, wherein a value of at least one first parameter of the second voltage pulses and the first pulsed voltage waveform are different based on a difference in the first portion and the second portion of the first synchronization waveform signal.

* * * * *